United States Patent [19]
Takasugi

[11] Patent Number: 6,069,639
[45] Date of Patent: May 30, 2000

[54] VIDEO CAMERA SYSTEM AND SEMICONDUCTOR IMAGE MEMORY CIRCUIT APPLIED TO IT

[75] Inventor: Atsushi Takasugi, Tokyo, Japan

[73] Assignee: Oki Electric Industry Co., Ltd., Tokyo, Japan

[21] Appl. No.: 08/973,764

[22] PCT Filed: Apr. 16, 1997

[86] PCT No.: PCT/JP97/01316

§ 371 Date: Dec. 8, 1997

§ 102(e) Date: Dec. 8, 1997

[87] PCT Pub. No.: WO97/39453

PCT Pub. Date: Oct. 23, 1997

[30] Foreign Application Priority Data

Apr. 16, 1996 [JP] Japan .................................. 8-093894

[51] Int. Cl.[7] .................................................. G06F 13/16
[52] U.S. Cl. .................. 345/521; 345/515; 345/516; 345/509; 365/189.01; 365/230.02
[58] Field of Search ........................... 345/521, 515–516, 345/507, 509; 365/189.01–189.03, 189.05, 189.07, 230.01, 230.02

[56] References Cited

U.S. PATENT DOCUMENTS

| | | | |
|---|---|---|---|
| 4,710,903 | 12/1987 | Hereth et al. | 365/194 |
| 4,899,316 | 2/1990 | Nagami | 365/189.01 |
| 5,646,684 | 7/1997 | Nishizawa et al. | 348/231 |
| 5,805,518 | 9/1998 | Hashimoto et al. | 365/221 |

FOREIGN PATENT DOCUMENTS

| | | |
|---|---|---|
| 62-42393 | 2/1987 | Japan . |
| 62-152050 | 7/1987 | Japan . |
| 62-152051 | 7/1987 | Japan . |
| 4-251349 | 9/1992 | Japan . |
| 8-116481 | 5/1996 | Japan . |

*Primary Examiner*—Raymond J. Bayerl
*Assistant Examiner*—Sy D. Luu
*Attorney, Agent, or Firm*—Jones Volentine, LLP

[57] ABSTRACT

Digital image data are input to a graphic memory circuit (G), and digital data stored in said graphic memory circuit (G) are read out using a control circuit (H). The graphic memory (G) has a control signal generator (N) for outputting a control signal (WAIT) during a read transfer or a write transfer, and an general purpose memory interface for receiving control signals (e) of a general purpose semiconductor memory. When the control circuit (H) is not outputting the control signal (WAIT), accesses to the graphic memory (G) are executed using general purpose memory control signals (e).

21 Claims, 22 Drawing Sheets

VIDEO CAMERA SYSTEM AND SEMICONDUCTOR IMAGE MEMORY CIRCUIT APPLIED TO IT

TECHNICAL FIELD

The present invention relates to a video camera system and a graphic memory circuit, and particularly to a graphic memory circuit utilizing a dynamic random access memory (DRAM).

BACKGROUND ART

Conventionally, in a general purpose memory conforming to international standards for DRAMs, since control methods for these devices are common throughout the world, general purpose controllers for controlling such memory devices inevitably exist. Also, it is common place for a general main processor unit (MPU) to have a standardized general purpose memory controller built in.

On the other hand, since a general purpose controller can not be used with a non-general purpose memory, users must develop their own custom controller.

Conventional non general purpose memories have been developed to satisfy demands that can not be achieved using general purpose memories.

Maintaining the functions of the non-general purpose application, use of accumulated information stored inside the memory would be extremely convenient if this information could be directly accessed from a general purpose DRAM controller or an MPU having a general purpose DRAM controller.

Non general purpose memories are basically being designed making use of general purpose memories. Accordingly, it is possible to improve the design of control input signals that are extremely similar to those of a general purpose DRAM. However, it is not possible to achieve exactly the same control.

The timing of DRAM control signals generated from a DRAM controller and the timing at which memory output is latched is fixed, which means that it is extremely difficult to provide memory control that improves on control that is very similar that of general purpose DRAM.

Signals are output from a memory side to a memory controller of an MPU, and the basic concept of the present invention is to control the operation of the controller or MPU.

A specific example of a system using the conventional method will now be described.

A keyboard or a mouse is a human interface for a personal computer (hereinafter referred to as a PC). However, a digital video camera has recently become popular as a human interface. It is possible to transfer a digital image taken by the digital camera to a PC.

An dedicated memory called a field memory (referred to as FRAM below) is usually used in a digital camera (operation will be described later). A simplified block diagram of a video camera system that can transfer a digital image to a PC is shown in FIG. 1.

The operation of the video camera system of FIG. 1 will now be described.

First of all, the video camera section A will be described. An image (a) is taken in and a charged coupled device (CCD) (B) generates corresponding analog data (b). This analog data (b) is converted into digital data by an analog to digital converter (A/D) (C), and is input to the FRAM (G).

Accumulated digital image data is then processed taking advantage of digital image techniques such as time axis correction and filtering, according to control signals (d) of the controller (D).

On the other hand, when considering an interface between the video camera and a PC, since the image data is extremely large, problems arise such as the fact that a buffer for temporary storage becomes large and the time taken to transfer the image data to the PC becomes excessive. Accordingly, it becomes necessary to compress the image data, and the method generally used is called JPEG compression (actually, there are various compression methods, and the present invention is not limited to JPEG compression, but JPEG compression will be used here). In JPEG compression, complicated computation is required, and the load on an MPU is substantial.

In order to carry out JPEG compression, it is therefore currently necessary to include an MPU (H) and a general purpose DRAM (M, I, J) controlled by the MPU in the conventional video camera section. Functions of the general purpose DRAM, such as a temporary buffer (M), a compression data buffer (I), and a work area (J) are separated.

The MPU (H) can not directly access the FRAM (G), and so image information (e) stored in the MPU (H) must be transferred to the temporary buffer (M) beforehand. Image information (e') in the temporary buffer (M) is subjected to compression by the MPU (H), and the compressed output data (h) are stored in a compression data buffer (I). Work area (J) is used as a work in progress work area.

Compressed data (f) stored inside the compression data buffer (I) are transferred to the PC via the interface (K). Compressed data (f) can also be expanded in the video camera and transferred to an FRAM.

Next, an FRAM widely used in television related systems will be described as an example of a memory that is not general purpose.

FIG. 3 is a circuit diagram, of a conventional FRAM. A memory cell unit $Q_{ij}$ (i=1–m, j=1–n) is comprised of a capacitor and a transistor. As shown in FIG. 3, the sense amplifiers $SA_i$ (i=1–m) are connected to bit line pairs $BL_i$, $BL_i$/ connecting a plurality of memory cell units, in serial memory column units A.

The bit line pairs $BL_i$, $BL_i$/ (i=1–m) are connected at one end through opening and closing means Trib, Trib/ being opened and closed by an opening and closing signal WRT to write data register units $Fi1$ (i=1–m), and are connected at the other end through opening and closing means Tric, Tric/, being opened and closed by an opening and closing signal RTR, to read data register units $Fi2$ (i=1–m).

The write data register units $Fi1$ (i=1–m) are connected, via opening and closing means Tria, Tria/, being opened and closed by an output $WY_i$ (i=1–m) of the Y decoder means for use in a write operation B, to data transfer means (write data bus pair) WD, WD/ for connecting to input means D which receives as input an input enable signal DIE. An input terminal DI is connected to the input means D.

The read data register units $Fi2$ (i=1–m) are connected, via opening and closing means Trid, Trid/ being opened and closed by an output $RY_i$ (i=1–m) of the Y decoder means for use in a read operation C, to data transfer means (read data bus pair) RD, RD/ for connecting to output means G which receives as input an output enable signal DOE. An output terminal DO is connected to the output means G.

A word line $WL_j$ (j=1–n) is selected by X decoder means E receiving write X address WXA, read X address RXA and a word line drive signal PW as inputs.

Write Y address WYA and Y address drive signal WCL are input to the Y decoder means for use in a write operation B, while read Y address RYA and read Y address drive signal RCL are input to the Y decoder means for use in a read operation C.

Y address buffer P, receiving external Y address signal YAD as input and outputting write Y address WYA and read Y address RYA is controlled by a control signal SRW for determining whether an output address is a read or a write (if the Y address buffer is separate for read and write, this signal is not necessary), and read address capture signal RADE and write address capture signal WADE.

X address buffer Q receiving external X address signal XAD as input and outputting write X address WXA and read X address RXA is controlled by a control signal SRW for determining whether an output address is a read or a write (if the X address buffer is separate for read and write, this signal is not necessary), and read address capture signal RADE and write address capture signal WADE.

The memory control signal generating circuit R receiving external input signals of a read clock signal RCLK, a read enable signal RE, a write clock signal WCLK, a write enable signal WE and an address enable signal ADE outputs the previously mentioned memory control signals, namely the read address capture signal RADE, write address capture signal WADE, output enable signal DOE, input enable signal DIE, control signal SRW, write Y address drive signal WCL, read Y address drive signal RCL, opening and closing signals RTR, WTR, and word line drive signal PW.

The circuit operation of the conventional FRAM shown in FIG. 3 will now be described with respect to time using FIG. 5 and FIG. 6.

(1) Read operation (refer to FIG. 5)

At time t0, signals XAE and RYAE become H level in synchronism with read clock signal RCLK, and external address signals XAD, YAD are taken in. After that, a word line WLn is selected and memory information (Information that will be read out from here) is put on the bit line pair BLi, BLi/ (i=1−m). Operation after the above described operation is called "read transfer".

Next, at time t1 an opening and closing signal RTR is set to a high level, and the memory information on the bit line pair BLi, BLi/ (i=1−m) is transferred to a read data register unit Fi2 (i=1−m).

At time t2, the transfer that started at time t1 completes, and the word line WLn is dropped. At time t3, the read enable signal RE becomes a high level and the DRAM section returns to a reset state.

At time t4, signal YR1 rises in synchronism with the read clock signal RCLK, and information accumulated in the read data register unit F12 is transferred to the read data bus pair RD, RD/ and information DO is output by the output means.

At time t5, similarly to the operation at time t4, signal YR2 rises in synchronism with the read clock signal RCLK, information accumulated in the read data register unit F22 is transferred to the read data bus pair RD, RD/ and information DO is output by the output means.

The above operation is repeated up until time t6, and serial output is realized.

(2) write operation (refer to FIG. 6)

At time t0, signals XAE and WYAE become high level in synchronism with write clock signal WCLK, and external address signals XAD, YAD are taken in.

Next, at time t1, input enable signal DIE becomes a high level (not shown in FIG. 6), and input information DI inputted by the input means is transferred to the write data bus pair WD, WD/, and transferred to the write data register unit F11 when the signal YW1 becomes high in synchronism with the write clock signal WCLK.

At time t2, similarly to the operation at time t1, input information DI is transferred to F21 by signal YW2 becoming a high level in synchronism with write clock signal WCLK.

By repeating similar operations up to time t3, input information DI is transferred to write data register unit Fk1 in synchronism with the kth rising of the write clock signal WCLK counting from time t1.

At time t4, after a fixed time has elapsed from time t3, information that has been transferred to the write data register unit Fi1 (i=1−m) is transferred to the bit line pair BLi, BLi/ by opening and closing signal WTR. The opening and closing signal WTR goes high on the falling of write enable signal WE after time t3, or as a result of another external signal. At the same time, the information is transferred to a DRAM memory cell connected to word line WLn that is activated via that word line Wln. Operation after the above described operation is called "write transfer".

Finally, at time t5, transfer to the DRAM memory cell is completed, the word line WLn is dropped, and the memory circuit is put in a reset state.

The conventional FRAM has a problem that direct access can not be made from the general purpose DRAM controller section of the MPU (or the general purpose DRAM controller). Because of this, image information being stored within the FRAM memory cells must be stored again in a general purpose DRAM that can be controlled from a control section of the MPU. Also, the memory capacity of a temporary buffer (M) is wasted.

It is preferable for the FRAM to be controlled by the DRAM controller, but this is impossible in a conventional FRAM. Since an FRAM is basically designed as a DRAM, it is possible to utilize an interface circuit for modifying to very similar control. However, complete access is not possible using a control signal generated by the general purpose DRAM controller, because of the specific circuit system of the FRAM. For example, a general purpose DRAM is basically controlled by two signals, RAS/ and CAS/, but after an MPU has made both signals active, memory output is taken in at a determined timing. However, the FRAM has a problem in that it can not be made to provide an output for a certain period.

In a memory such as a conventional FRAM, in which a data register group (Fi1, Fi2 in FIG. 3 (i=1−m)) is connected to a DRAM memory cell and high speed access is possible, it can basically be operated using only necessary control signals among the control signals for a general purpose DRAM, since the active component is the DRAM. However, operation is different from a general purpose DRAM because of the feature that data is indirectly accessed in the memory array through a data register. Accordingly, this difference is responsible for the major drawback that the FRAM can not be controlled using a DRAM controller that is generally available on the market. For example, the fact that a write access requires the time tWD necessary for the write transfer shown in FIG. 6, and the fact that a read access requires the time tRD necessary for a read transfer shown in FIG. 5, is different from a general purpose DRAM.

Recently, highly functional MPUs have been making significant and rapid inroads into the market, and it has become commonplace for them to have a built in memory controller for general purpose use. However, an FRAM is not supported since it is not a general purpose memory. Particularly, in a digital still camera, image information stored in an FRAM must be compressed by the MPU using JPEG compression or the like. However, in the conventional art, since the FRAM can not access the DRAM controller built into the MPU, information in the FRAM must be transferred to the general purpose DRAM in order to carry out the compression processing. If the FRAM could access the DRAM controller, this problem would be solved.

The points of difference between an FRAM and a typical general purpose DRAM are that a write access involves a write transfer operation, and a read access involves a read transfer operation (and if there is self refresh, then a self refresh operation). In a typical DRAM controller of the related art, an access can not wait during a control operation, and particularly during the above mentioned time tRD (for example, in a general purpose DRAM since output data is output immediately after an address has been input, an output is strobed on the controller side after the address has been input), and a write transfer operation (or in the case of a self refresh function, a self refresh operation) is an operation internal to the FRAM, and since determination can not carried out from the controller side (that is, from outside) a normal DRAM controller (which can arbitrate access operations) can not control an FRAM.

SUMMARY OF THE INVENTION

In a video camera system according to the present invention, in which digital image data are input to a graphic memory circuit, and digital data stored in the graphic memory circuit are read out using a control circuit, there are provided a control signal generator for outputting a control signal (wait signal) when the graphic memory is in the middle of a read transfer or a write transfer, and a general purpose memory interface for receiving control signals of a general purpose semiconductor memory. When the control circuit is not outputting control signals, accesses to the graphic memory are executed using general purpose memory control signals.

A general purpose memory interface is used to make it possible to access a graphic memory circuit using general purpose memory control signals. Further, control signal generating means is used for a control circuit to reduce waiting time while the graphic memory circuit is executing a read transfer or a write transfer.

The main point of the present invention is to provide a device for outputting a wait signal, for causing a controller operation to wait, from an FRAM side to a DRAM controller (or an MPU), a certain time after a write transfer signal or a read transfer signal.

BEST MODE FOR PRACTICING THE INVENTION

Figure 1:
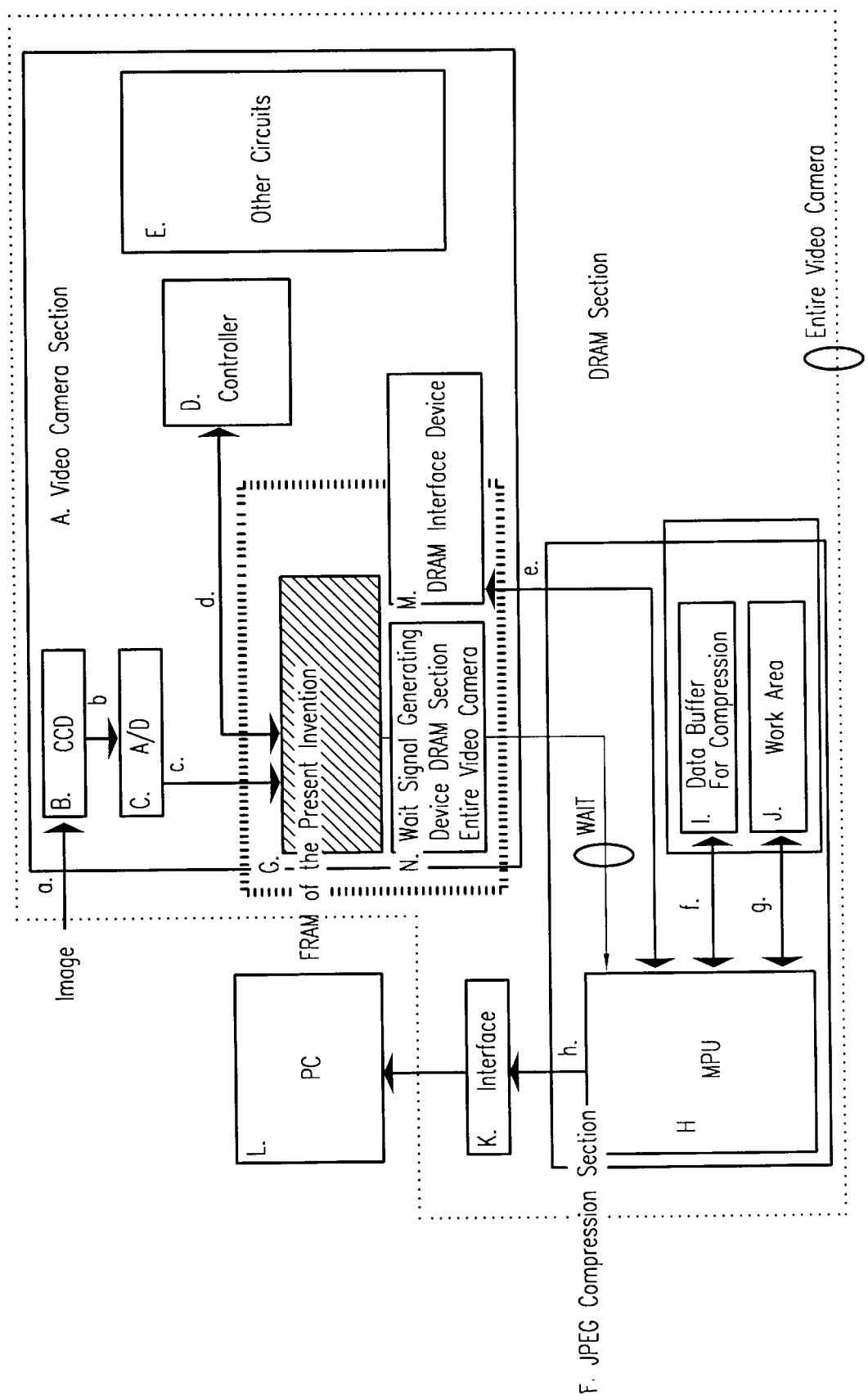
FIG. 1 is a drawing showing a video camera system of the present invention.

An FRAM of the present invention that provides a device for outputting a wait signal, for causing a controller operation to wait, from an FRAM side to a DRAM controller (or an MPU), a certain time after a write transfer signal or a read transfer signal, will be described with reference to the circuit diagram of FIG. 4.

A serial memory array H comprises a plurality of serial memory column units A. A memory cell unit $Q_{ij}$ (i=1–m, i=1–m) is comprised of a capacitor and a transistor. As shown in FIG. 4, a sense amplifier $SA_i$ (i=1–m) is connected to bit line pairs $BL_i$, $BL_i/$ and $BL_i$, $BL_i/$ that connect a plurality of memory cell units in a serial memory column unit A.

The bit line pairs $BL_i$, $BL_i/$ (i=1–m) are connected at one end through opening and closing means Trib, Trib/, being opened and closed by write transfer signal WTR, to write data register units $Fi1$ (i=1–m), and are connected at the other end through open close means Tric, Tric/, being opened and closed by read transfer signal RTR, to read data register units $Fi2$ (i=1–m). The write data register units $Fi1$ (i=1–m) are connected, via opening and closing means Tria, Tria/ being opened and closed by an output $WY_i$ (i=1–m) of the Y decoder means for use in a write operation B, to data transfer means (write data bus pair) WD, WD/ for connecting to input means D which receives as input an input enable signal DIE. An input terminal DI is connected to the input means D.

The read data register units $Fi2$ (i=1–m) are connected, via opening and closing means Trid, Trid/ being opened and closed by an output $RY_i$ (i=1–m) of the Y decoder means for use in a read operation C, to data transfer means (read data bus pair) RD, RD/ for connecting to output means G which receives as input an output enable signal DOE. An output terminal DO is connected to the output means G.

A word line WLj (j=1-n) is selected by X decoder means E receiving write X address WXA, read X address RXA and a word line drive signal PW as inputs.

Write Y address WYA and Y address drive signal WCL are input to the Y decoder means for use in a write operation B, while read Y address RYA and read Y address drive signal RCL are input to the Y decoder means for use in a read operation C.

Y address buffer P receiving external Y address signal YAD as input and outputting write Y address WYA and read Y address RYA is controlled by a control signal SRW for determining whether an output address is a read or a write (if the Y address buffer is separate for read and write, this signal is not necessary), and read address capture signal RADE and write address capture signal WADE.

X address buffer Q receiving external X address signal XAD as input and outputting write X address WXA and read X address RXA is controlled by a control signal SRW for determining whether an output address is a read or a write (if the X address buffer is separate for read and write, this signal is not necessary), and read address capture signal RADE and write address capture signal WADE.

A DRAM interface T receives as input external control signals representative of a general purpose DRAM, namely a row address strobe signal RAS/, a column address strobe signal CAS/, a write enable signal WE/ and an output enable signal OE/, and inputs the general purpose DRAM external control signals to a memory control signal generator R so as to be able to control the FRAM using the general purpose DRAM external control signals.

The memory control signal generating circuit R receiving external input signals of a read clock signal RCLK, a read enable signal RE, a write clock signal WCLK, a write enable signal W, an address enable signal ADE and an output signal from a DRAM interface T outputs the previously mentioned memory control signals, namely the read address capture signal RADE, write address capture signal WADE, output enable signal DOE, input enable signal DIE, control signal SRW, write Y address drive signal WCL, read Y address drive signal RCL, read transfer signal RTR, write transfer signal WTR, word line drive signal PW and, if there is a self refresh function, a self refresh signal SELF.

Control signals generated by the memory control signal generator (in this case word line drive signal PW, write transfer signal WTR, read transfer signal RTR, and, if there is a self refresh function, a self refresh signal SELF) are input to the wait signal generator S, and a wait signal WAIT is outputted as an external output.

Next, the operation of an FRAM of the present invention shown in FIG. 4 will be described.

(1) read operation

Figure 7:
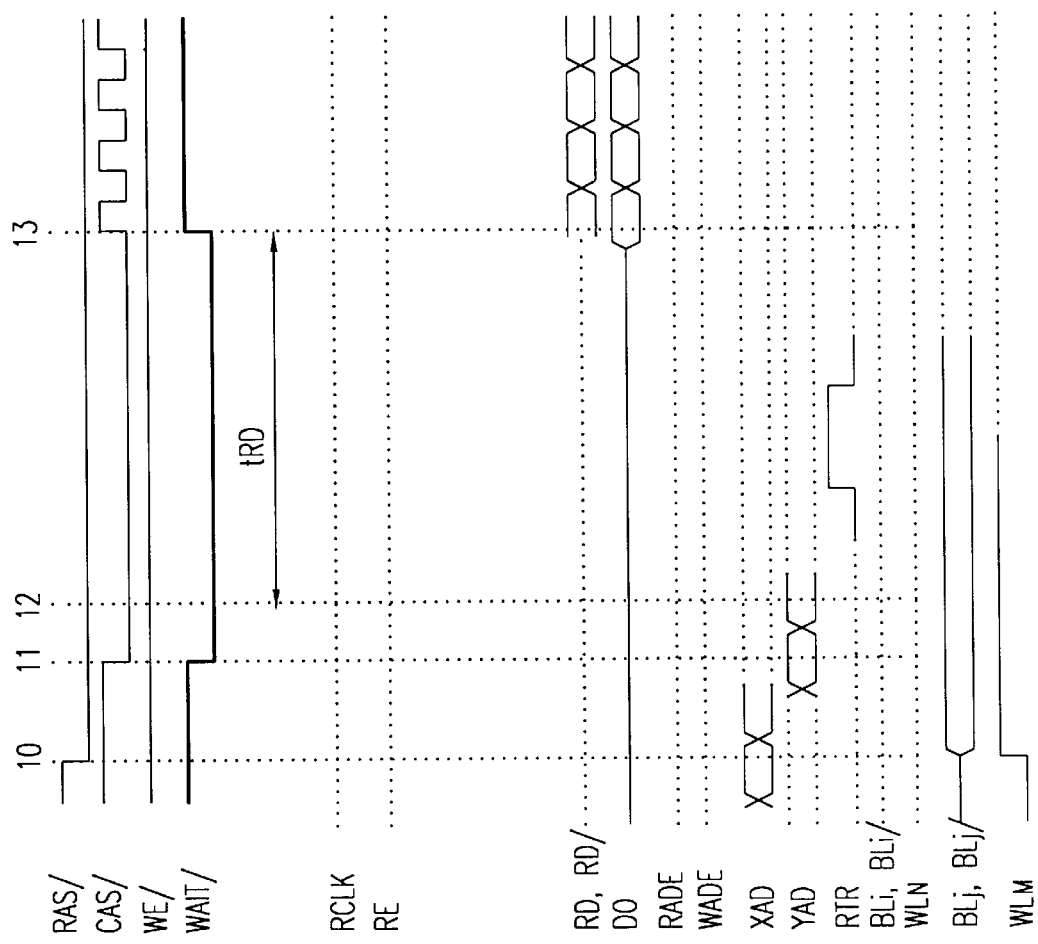
FIG. 7 is a drawing showing the read operation of an FRAM related to the present invention.

The read circuit operation of the FRAM of the present invention shown in FIG. 4 will now be described with respect to time using FIG. 7. The FRAM of the present invention is only an FRAM operated by control signals of a general purpose DRAM, and the memory operation is basically the same as the operation of a conventional FRAM. The difference lies in that general purpose DRAM control signals are used in the control.

First of all, at time t0, row address strobe signal RAS/ goes low, and X address XAD is capture d. A word line WLM and appropriate memory cells are selected by this X address XAD, and information from the memory cells is amplified on the bit lines.

At time t1, column address strobe signal CAS/ goes low, and a Y address YAD is captured. At this time, the wait signal WAIT goes low.

At time t2 which is some time after t1, the read transfer signal RTR rises, and information of the memory cell connected to word line WLM and amplified in the bit line pair is transferred to a read data register Fi2 (i=1-m). Memory cell information designated by the X address XAD and Y address YAD is output at fixed times (this is the leading bit of serial access mode).

Figure 5:
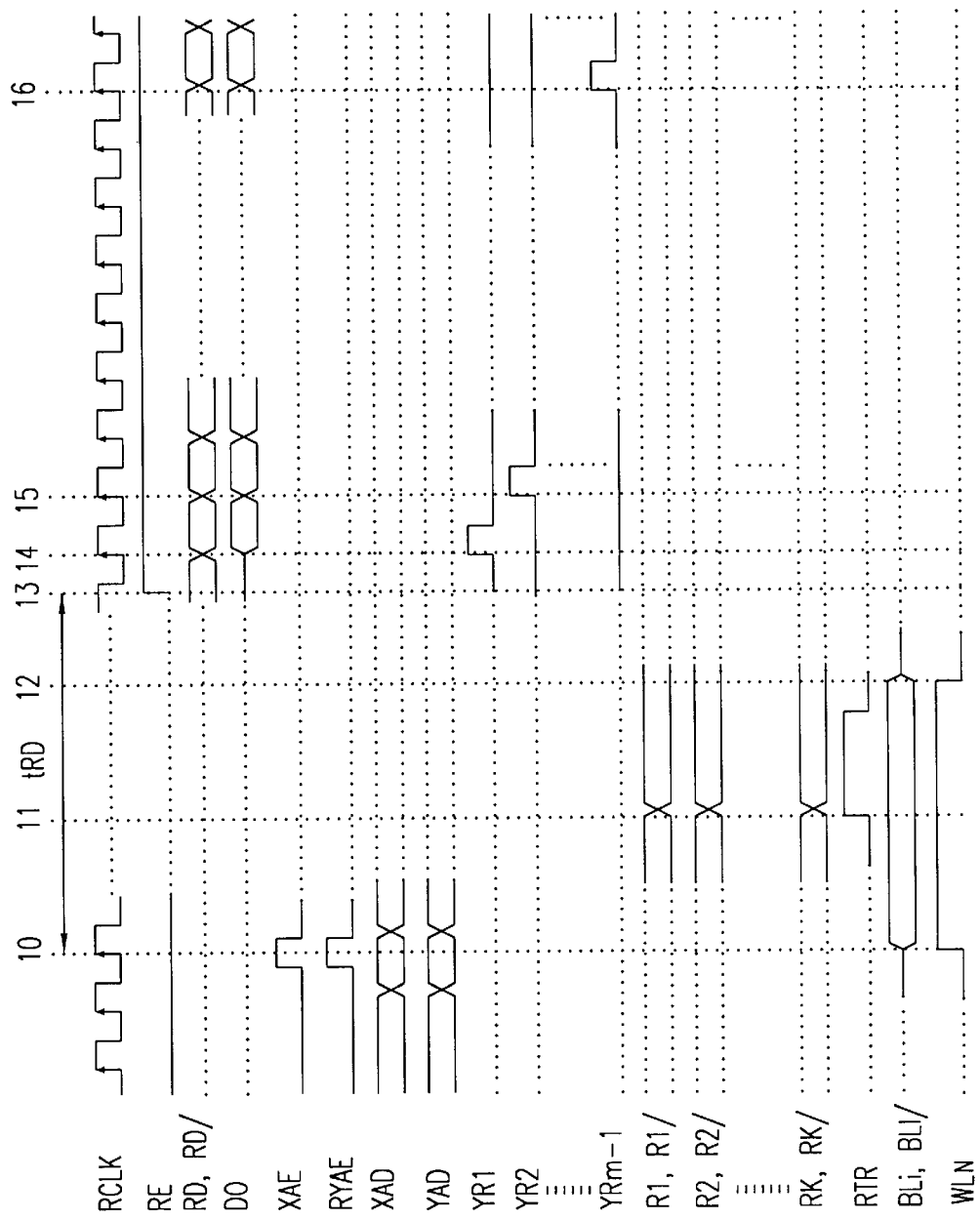
FIG. 5 is a drawing showing the read operation of a conventional FRAM.

Next, at time t3, column address signal CAS/ rises, and at the same time the wait signal WAIT/ also rises. After that, the column address signal CAS/ repeats a cycle of low, high, low high, like a clock signal, and serial mode is executed by a similar internal circuit operation to that described in FIG. 5.

(2) write operation

Figure 8:
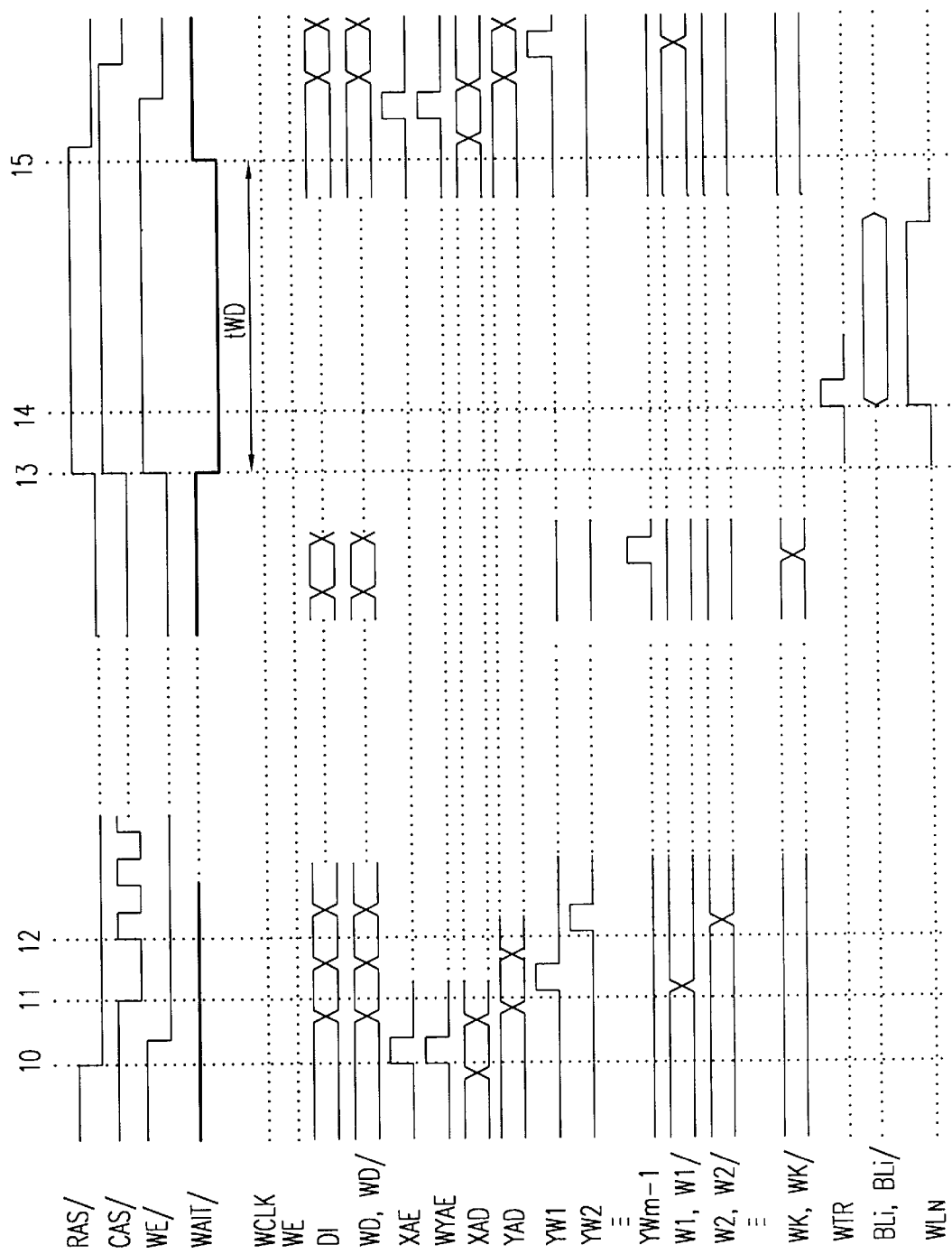
FIG. 8 is a drawing showing the write operation of an FRAM related to the present invention.

The write circuit operation of the FRAM of the present invention shown in FIG. 4 will now be described with respect to time using FIG. 8. The FRAM of the present is only an FRAM operated by control signals of a general purpose DRAM, and similarly to the read operation, the memory operation is basically the same as the operation of a conventional FRAM. (The difference lies in that general purpose DRAM control signals are used in the control.)

First of all, at time t0, the row address strobe signal RAS/ goes low, and an X address XAD is captured. A word line WLM and appropriate memory cells are selected by this X address XAD, and information from the memory cell is amplified on the bit lines.

Between time t0 and time t1, the write enable signal WE/ goes low and the device is put into write mode. Then, at time t1, the column address strobe signal CAS/ goes low, and a Y address YAD is captured. At this time, input information DI (not shown) is simultaneously captured by the input means D. This information is transferred to a register within the write data register Fi1 (i=1-m) designated by the input Y address YAD as serial write head data.

Figure 6:
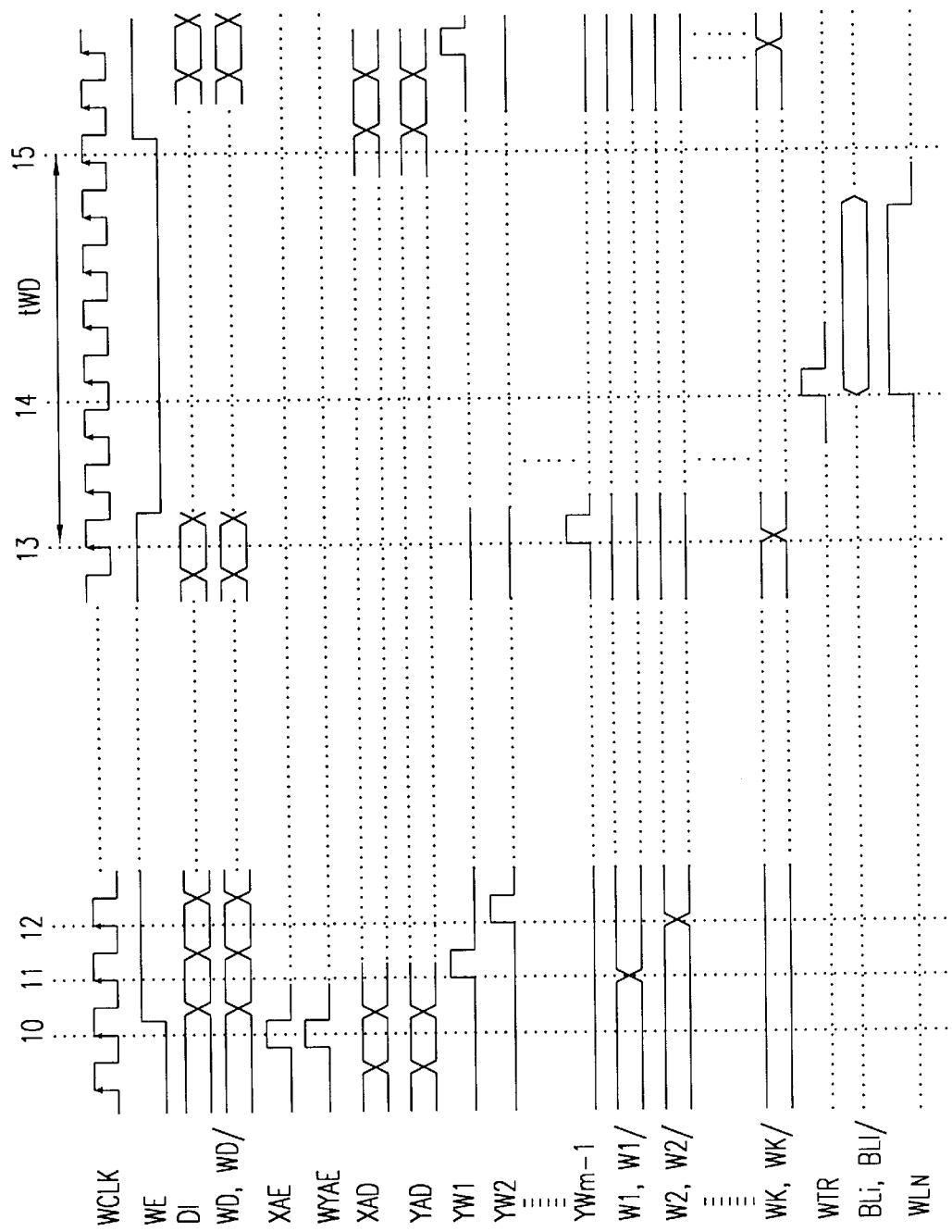
FIG. 6 is a drawing showing the write operation of a conventional FRAM.

Next, at time t2, column address strobe signal CAS/ goes high, and a wait signal WAIT/ is high. After that, the column address signal CAS/ repeats a cycle of low, high, low, high, like a clock signal, and serial write is executed for the write data register Fi1 (i=1-m) by a similar internal circuit operation to that described in FIG. 6.

At time t3, the serial write completes, the row address strobe signal RAS/, the column address strobe signal CAS/ and the write enable signal WE/ go high, and the wait signal WAIT/ goes low. At this point in time, the serial write to the write data register Fi1 (i=1-m) is completed. However, the write into the DRAM memory has not been executed. At time t4 after write to the write data register Fi1 (i=1-m) has been completed in t3, a data transfer from the write data register Fi1 (i=1-m) to the DRAM memory cell is carried out by the write transfer signal WTR going high. At this time, the word line WLN selected by the input address goes high and transfer data is written to the memory cell connected to this word line. In actual fact, the transfer data transferred by the write transfer signal WTR is transferred on to the bit line pairs BLi, BLi/ (i=1-m), subjected to amplification by the sense amplifier, and written into the memory cell.

At time t5, the write transfer completes, the internal circuit is put in a reset state, and when it is in a state where the next memory access becomes possible, the wait signal WAIT/ goes high. FIG.

Figure 2:
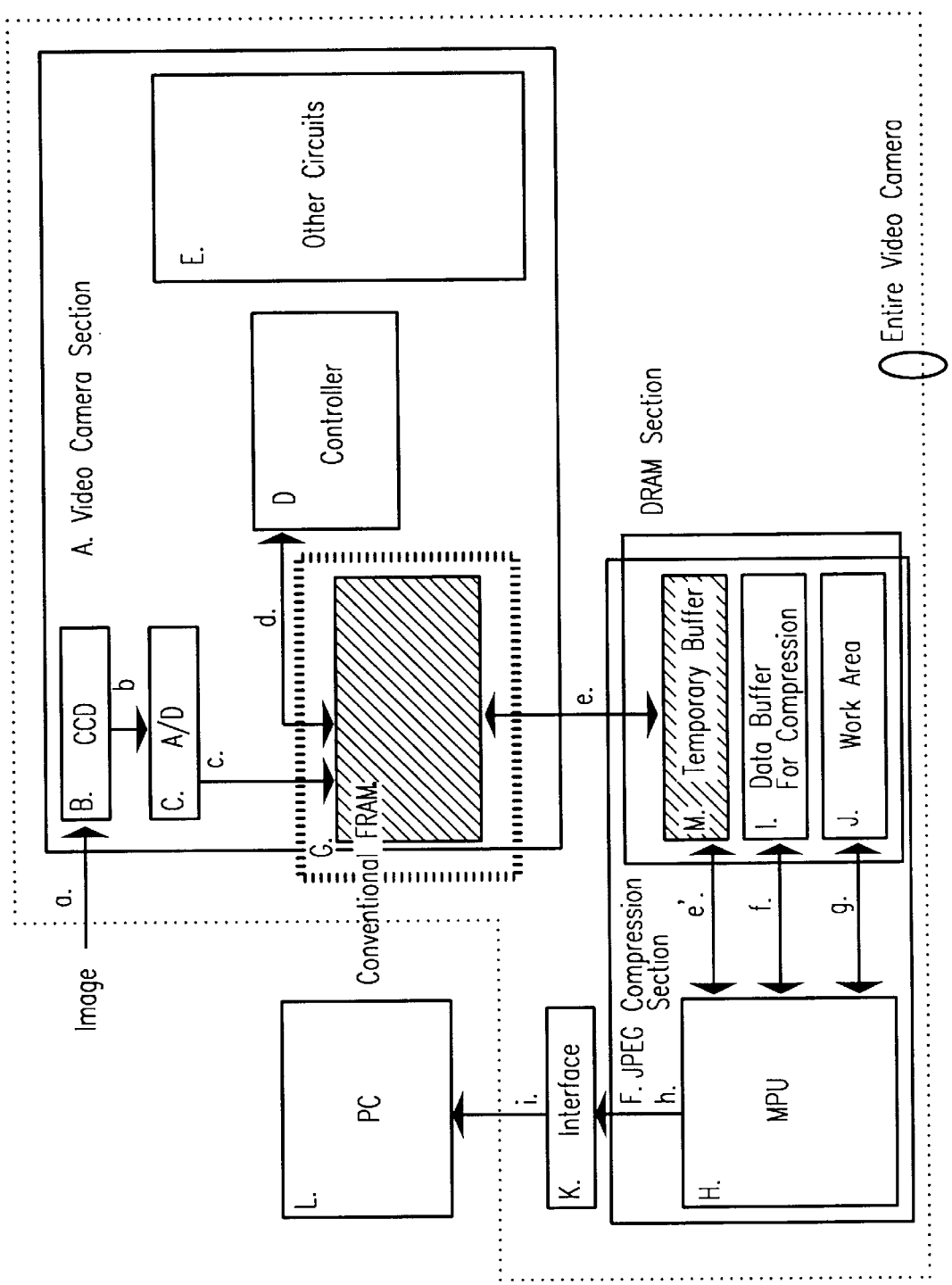
FIG. 2 is a drawing showing a conventional video camera system.
Figure 3:
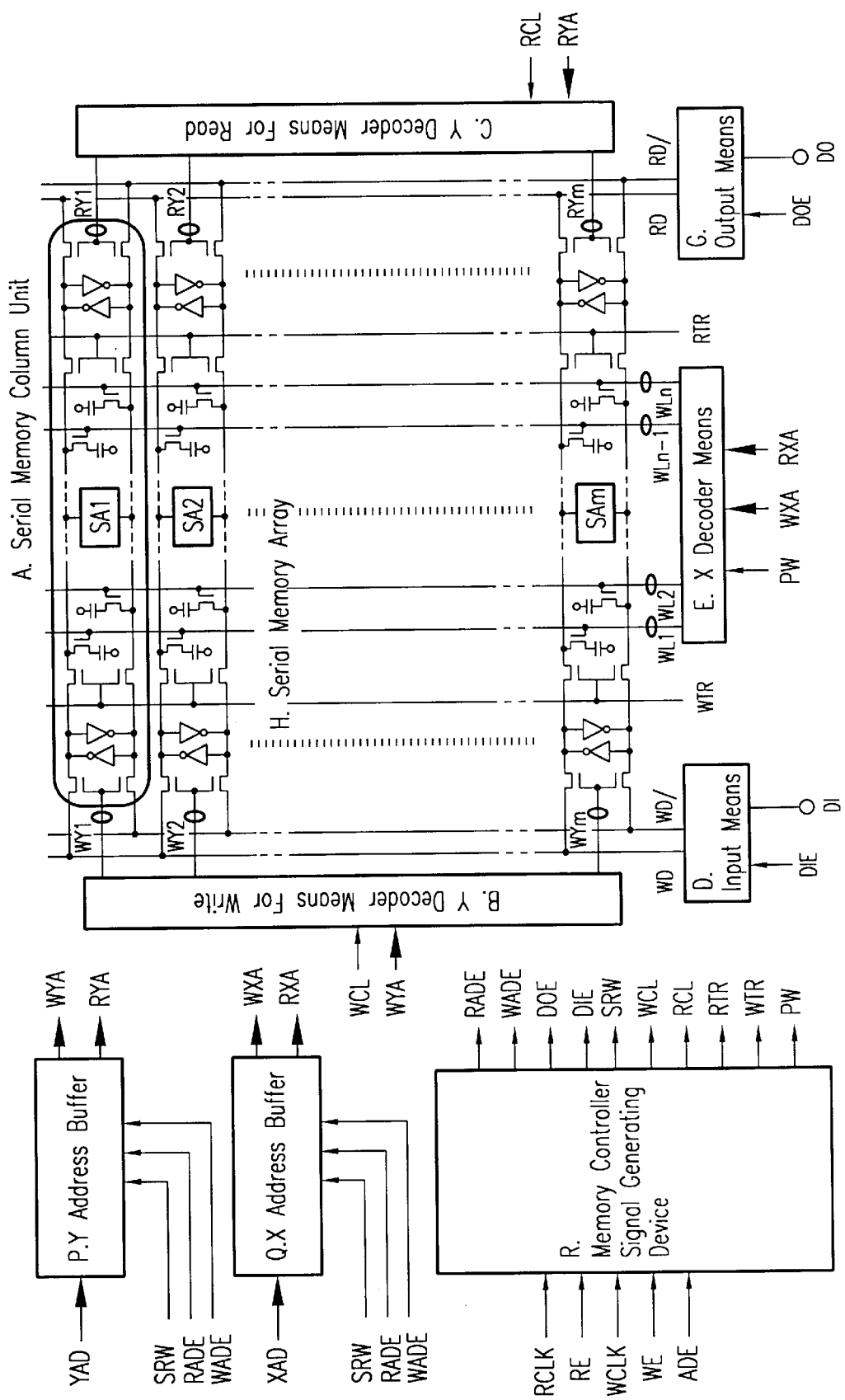
FIG. 3 is a drawing showing a conventional FRAM.
Figure 4:
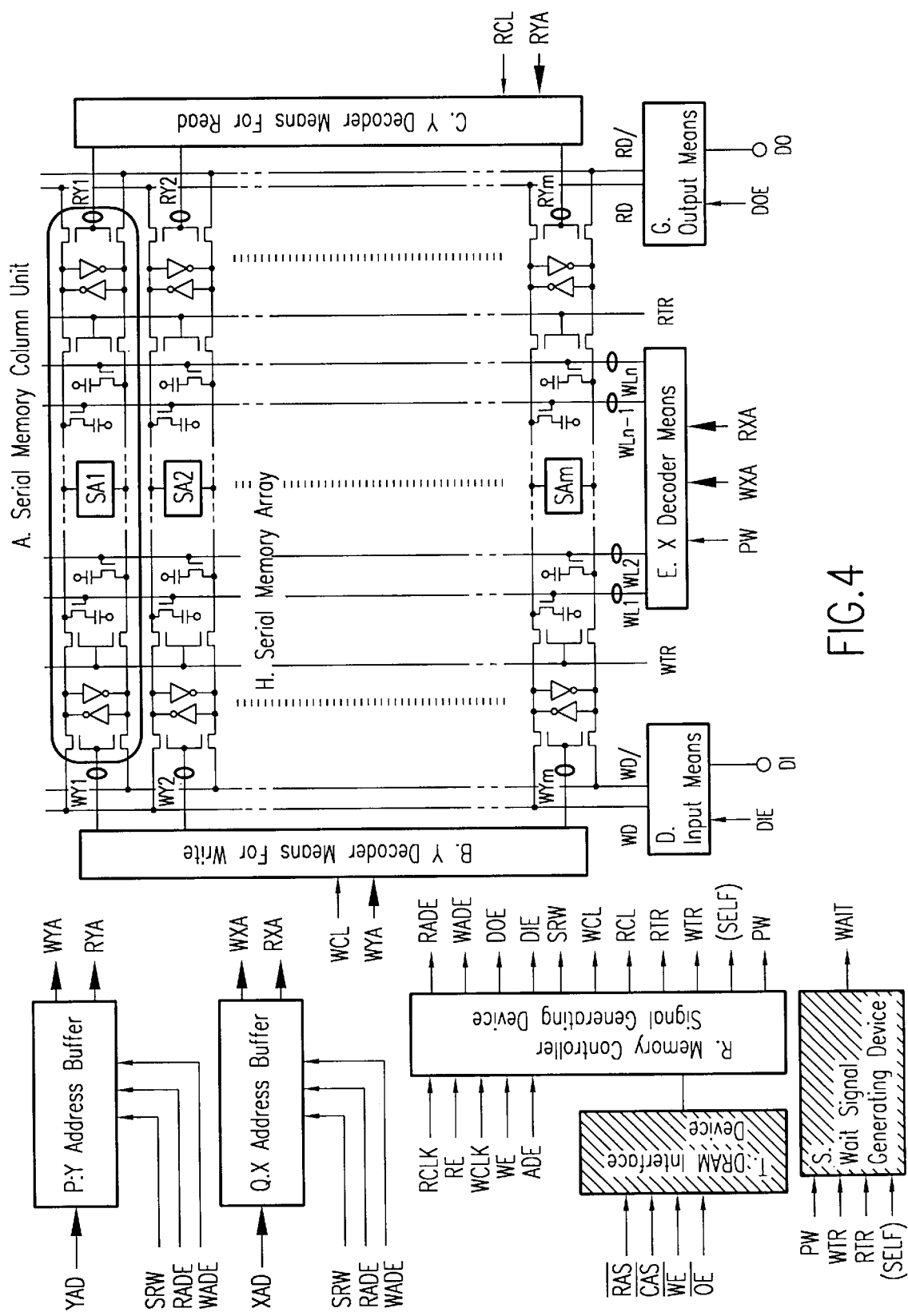
FIG. 4 is a drawing showing an FRAM related to the present invention.

FIG. 1 is an example of the FRAM shown in FIG. 4 being applied to a video camera system. As will be understood from comparison with FIG. 2, in the video camera system related to the present invention, there is no need to provide a temporary buffer in the DRAM section. The reason why there is no longer any need to provide a temporary buffer will be described together with the operation of the video camera system.

An image (a) is taken in by a CCD, and becomes analog data (b). This analog data (b) is converted to digital data by an analog to digital converter (A/D) (C), and is input to the FRAM (G). Accumulated digital image data is then processed utilizing digital image techniques such as time axis correction and filtering, according to control signals (d) of the controller (D). Up to this point, it is the same as a conventional video camera system.

The need for an MPU (H) and a general purpose DRAM (I, J) controlled by the MPU (H) is also the same as in the related art, but the only functions of the general purpose DRAM that are used are a compression data buffer (I) and a work area (J).

The MPU (H) receives a wait signal WAIT from the FRAM (G), as well as image information (e) being stored in the FRAM (G). A wait signal WAIT is output from the wait signal generator (N) of the FRAM (G) of the present invention. This wait signal WAIT prohibits the MPU (H) from accessing the FRAM (G) while the FRAM (G) is executing a write transfer or a read transfer. Also, the DRAM interface (M) in the FRAM of the present invention is provided so as to enable the FRAM to be operated using general purpose DRAM control signals, and so it is possible to operate the FRAM (G) in the same way as the general purpose DRAM (I, J).

Compressed output data that has been subjected to compression by the MPU (H) is stored in the compression data buffer (I). The work area (J) is used as a work in progress work area. Compression data (f) is transferred to a PC through the interface (K). Compressed data (f) can also be expanded in the video camera and transferred to an FRAM. This operation is the same as in the related art.

The general concept of sections of the present invention have been described above, but a concrete embodiment will now be described below. In order to simplify the following illustration, the control signals will not be described in detail.

Figure 9:
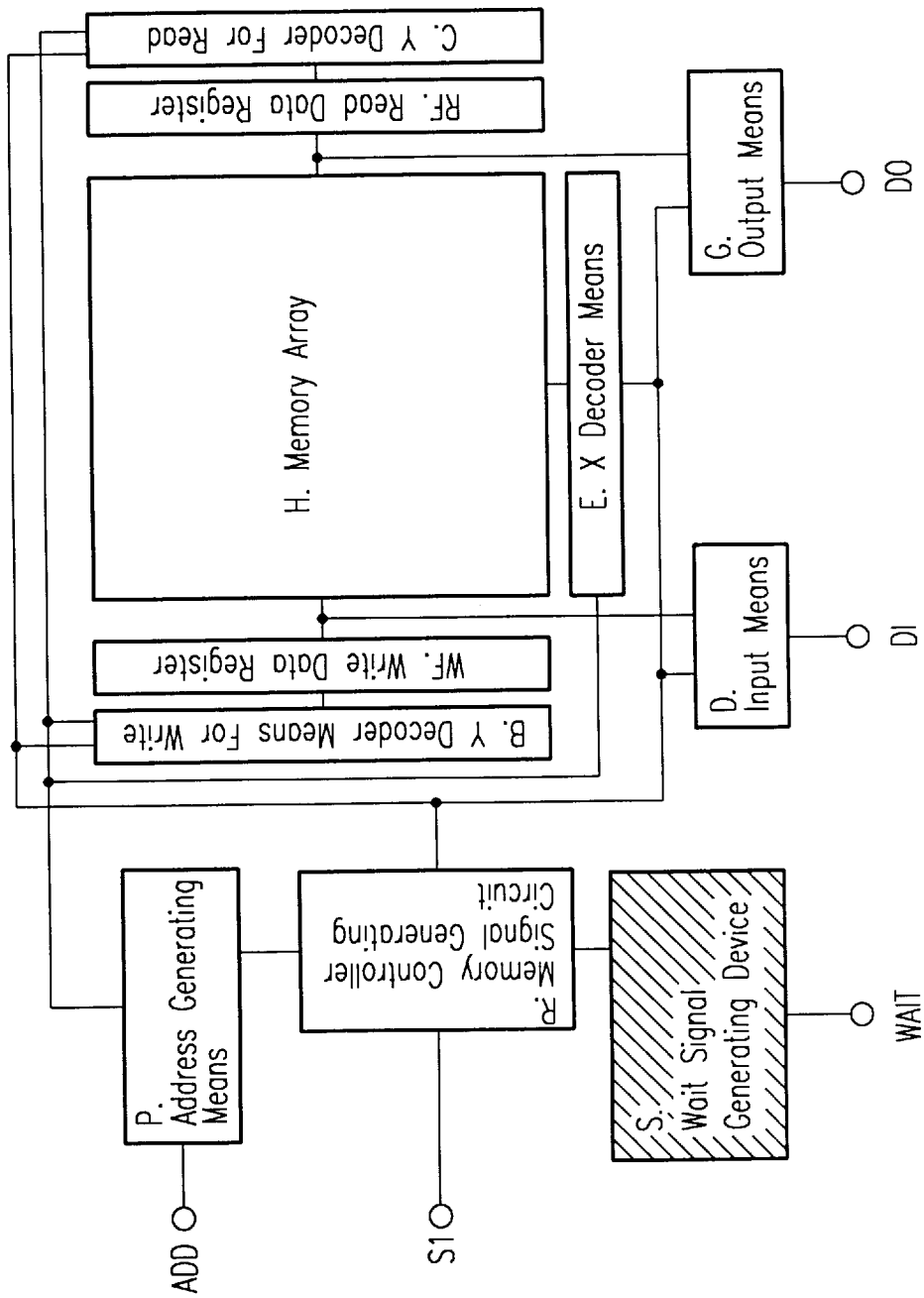
FIG. 9 is a drawing showing a first embodiment of this embodiment.

FIG. 9 is a block diagram showing a first embodiment of an FRAM of the present invention.

In this embodiment, a wait signal generating section S is provided for generating a wait signal that can be used when it is desired to interrupt memory access control from outside. This wait signal generating section S has a function of outputting a wait signal when the FRAM is executing a write transfer or a read transfer, and is connected to the memory control signal generator R.

The Y address buffer P and X address buffer Q described in FIG. 4 are collectively referred to as address means P, and an external address is called ADD. Further, signals input to the memory control signal generating means are collectively called S1. These abbreviations are also the same in later embodiments.

According to the first embodiment, since a wait signal is output when the FRAM is in the middle of executing a write transfer or a read transfer, the wait signal can be used as a signal for prohibiting access to the FRAM.

Figure 10:
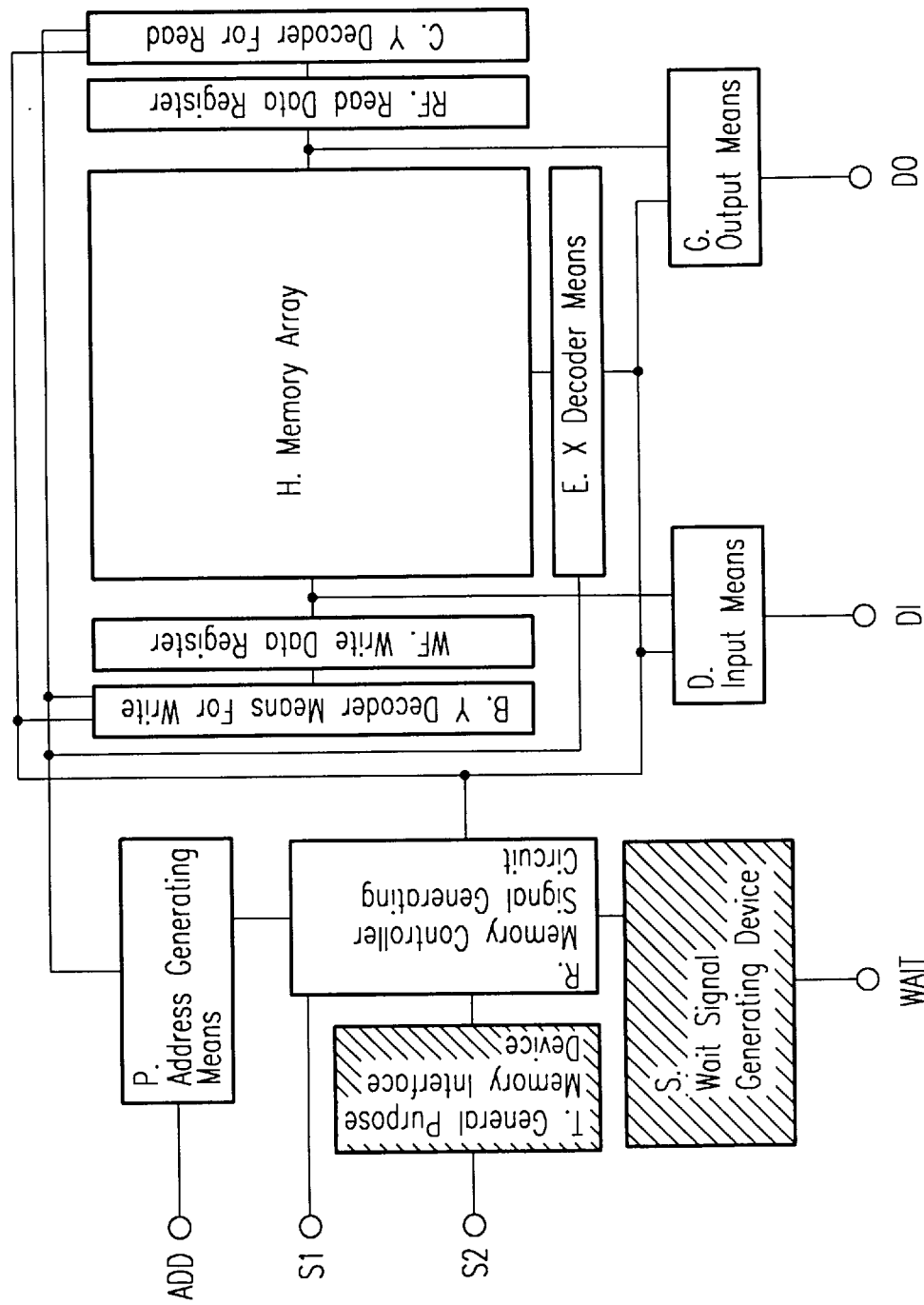
FIG. 10 is a drawing showing a second embodiment of this embodiment.

FIG. 10 is a block diagram showing a second embodiment of the present invention.

In this embodiment, a wait signal generating section S is provided for generating a wait signal that can be used when it is desired to interrupt memory access control from outside, as well as a general purpose memory interface T for receiving general purpose memory control signals and controlling the FRAM based on these received signals. The wait signal generating section S has a function of outputting a wait signal when the FRAM is executing a write transfer or a read transfer, and is connected to the memory control signal generator R. The general purpose memory interface T is also connected to the memory control signal generator R.

The general purpose memory interface has the same operation as the DRAM interface described in FIG. 4. Description etc. of the detailed operation is the same as that described in FIG. 7 and FIG. 8, and so will be omitted here.

Control signals input to the general purpose memory interface are collectively referred to as S2. This abbreviation is also the same in later embodiments.

According to the second embodiment, similarly to the first embodiment, since the wait signal is output when the FRAM is in the middle of executing a write transfer or a read transfer, the wait signal can be used as a signal for prohibiting access to the FRAM. It is also possible to control the FRAM using control signals used by the general purpose memory, because of the general purpose memory interface.

Figure 11:
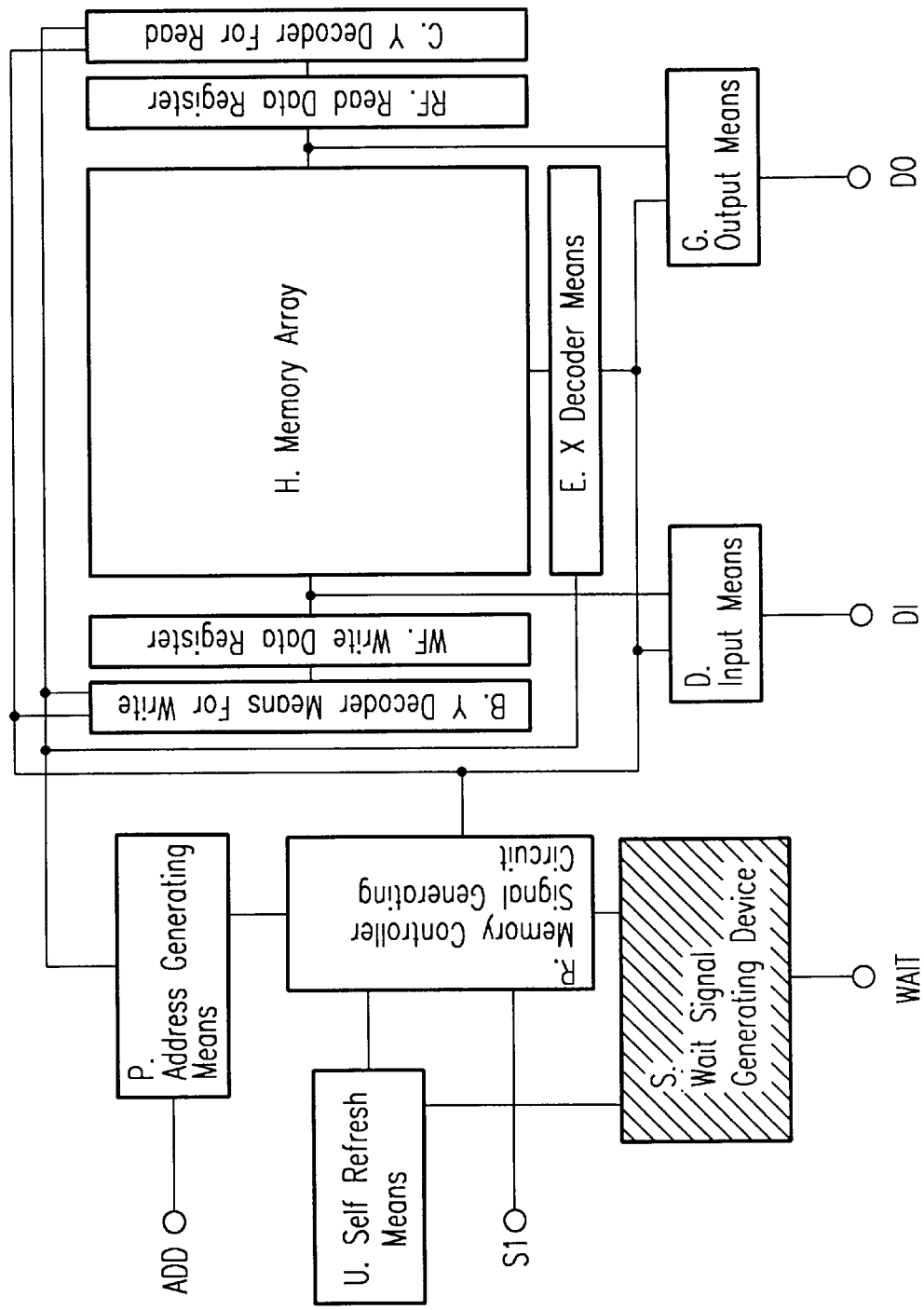
FIG. 11 is a drawing showing a third embodiment of this embodiment.

FIG. 11 is a block diagram showing an FRAM of a third embodiment of the present invention.

In this embodiment, self refresh means U are provided in the FRAM of the first embodiment. In this embodiment, when it is desired to interrupt memory access control from outside, the wait signal generating section S has a function of outputting a wait signal when the FRAM is executing a write transfer, a read transfer, or a self refresh, and is connected to the memory control signal generator R and the self refresh means U.

According to the third embodiment, since the wait signal is output when the FRAM is in the middle of executing a write transfer, a read transfer, or a self refresh, the wait signal can be used as a signal for preventing access to the FRAM.

Figure 12:
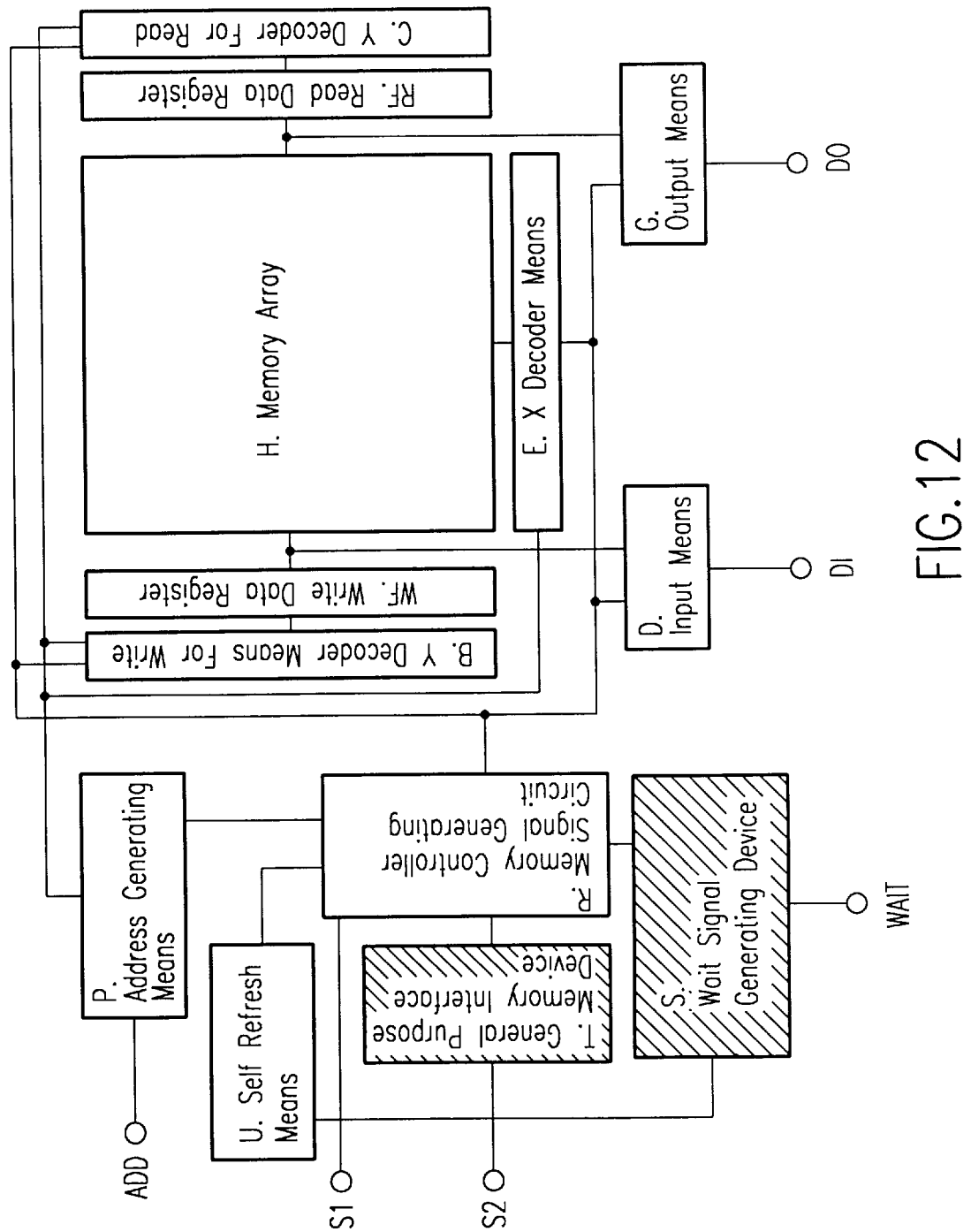
FIG. 12 is a drawing showing a fourth embodiment of this embodiment.

FIG. 12 is a block diagram showing an FRAM of a fourth embodiment of the present invention.

In this embodiment, there are provided a wait signal generating section S for generating a wait signal that can be used when it is desired to interrupt memory access control from outside, and also a general purpose memory interface T for receiving general purpose memory control signals and controlling the FRAM based on these received signals. The wait signal generating section S has a function of outputting a wait signal when the FRAM is executing a write transfer, a read transfer, or a self refresh, and is connected to the general purpose memory interface T and to the memory control signal generator R.

The general purpose memory interface is the same as in the second embodiment.

According to the forth embodiment, similarly to the third embodiment, since the wait signal is output when the FRAM is in the middle of executing a write transfer, a read transfer, or a self refresh, the wait signal can be used as a signal for preventing access to the FRAM. It is also possible to control the FRAM using control signals used by the general purpose memory, because of the general purpose memory interface.

Figure 13:
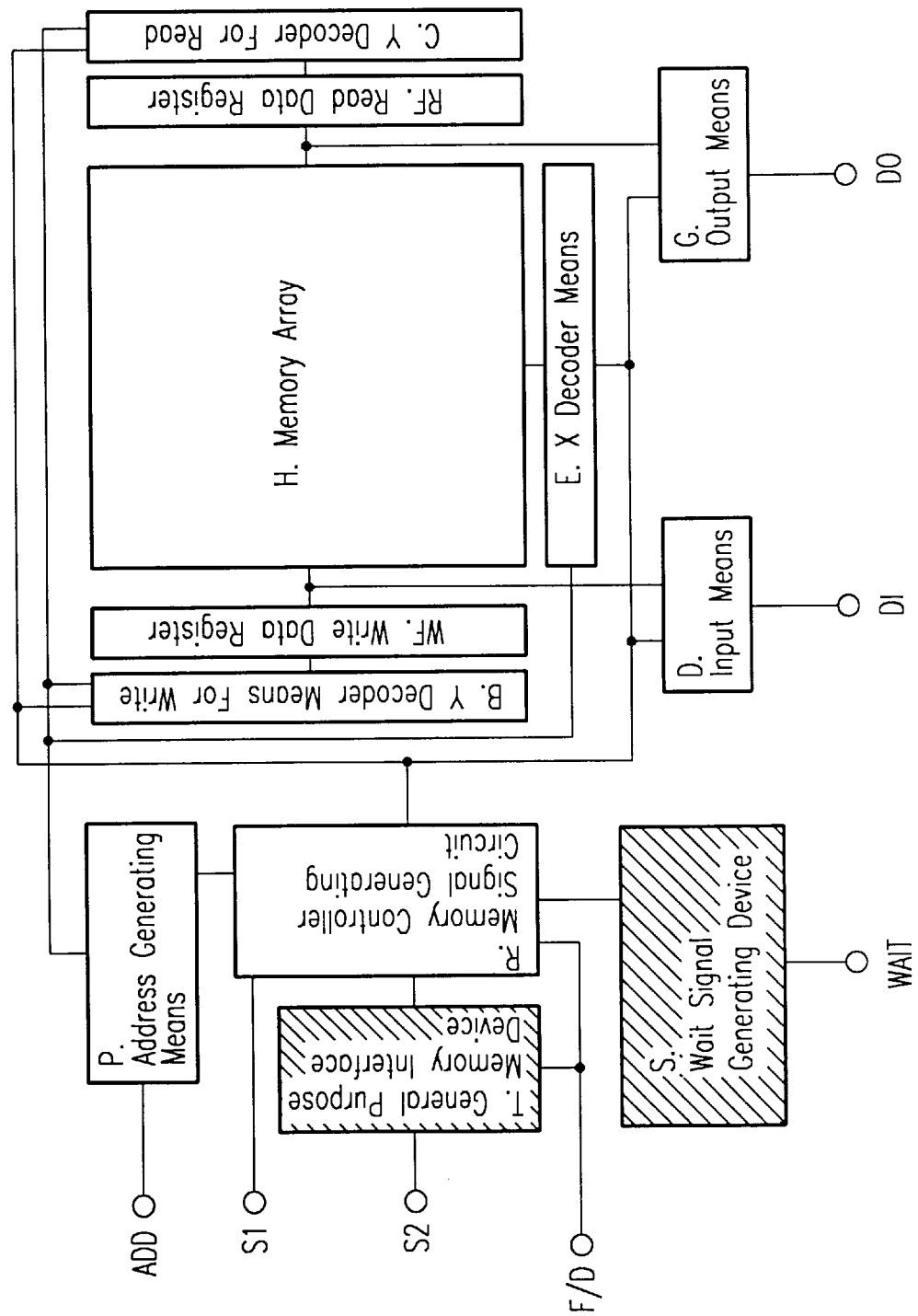
FIG. 13 is a drawing showing a fifth embodiment of this embodiment.

FIG. 13 is a block diagram showing an FRAM of a fifth embodiment of the present invention.

In this embodiment, there are provided a wait signal generating section S for generating a wait signal that can be used when it is desired to interrupt memory access control from outside, and also a general purpose memory interface T for receiving general purpose memory control signals and controlling the FRAM based on these received signals. The wait signal generating section S has a function of outputting a wait signal when the FRAM is executing a write transfer or a read transfer, and is connected to the general purpose memory interface T and to the memory control signal generator R.

Further, in this embodiment, an external selection input terminal F/D is connected to the general purpose memory interface T and the memory control signal generator R. The general purpose memory interface T only inputs input signals (general purpose memory control signals) S2 to the memory control signal generator R when the external selection signal designates general purpose memory control signals. The memory control signal generator R selects and receives the general purpose memory control signals S2. When the external selection signal designates control signals for FRAM, the general purpose memory interface T is put in a disabled state, and the memory control signal generator R selects and receives the control signals for FRAM S1. After that, the operation of the general purpose memory interface us the same as that in the second embodiment.

According to the fifth embodiment, it can be clarified according to the external selection signal whether control signals for FRAM or general purpose memory control signals are being received, and since the memory control signal generator R and the general purpose memory interface T can be controlled there is the advantage that it is possible to prevent erroneous operation. Other advantages are the same as those in the second embodiment.

Figure 14:
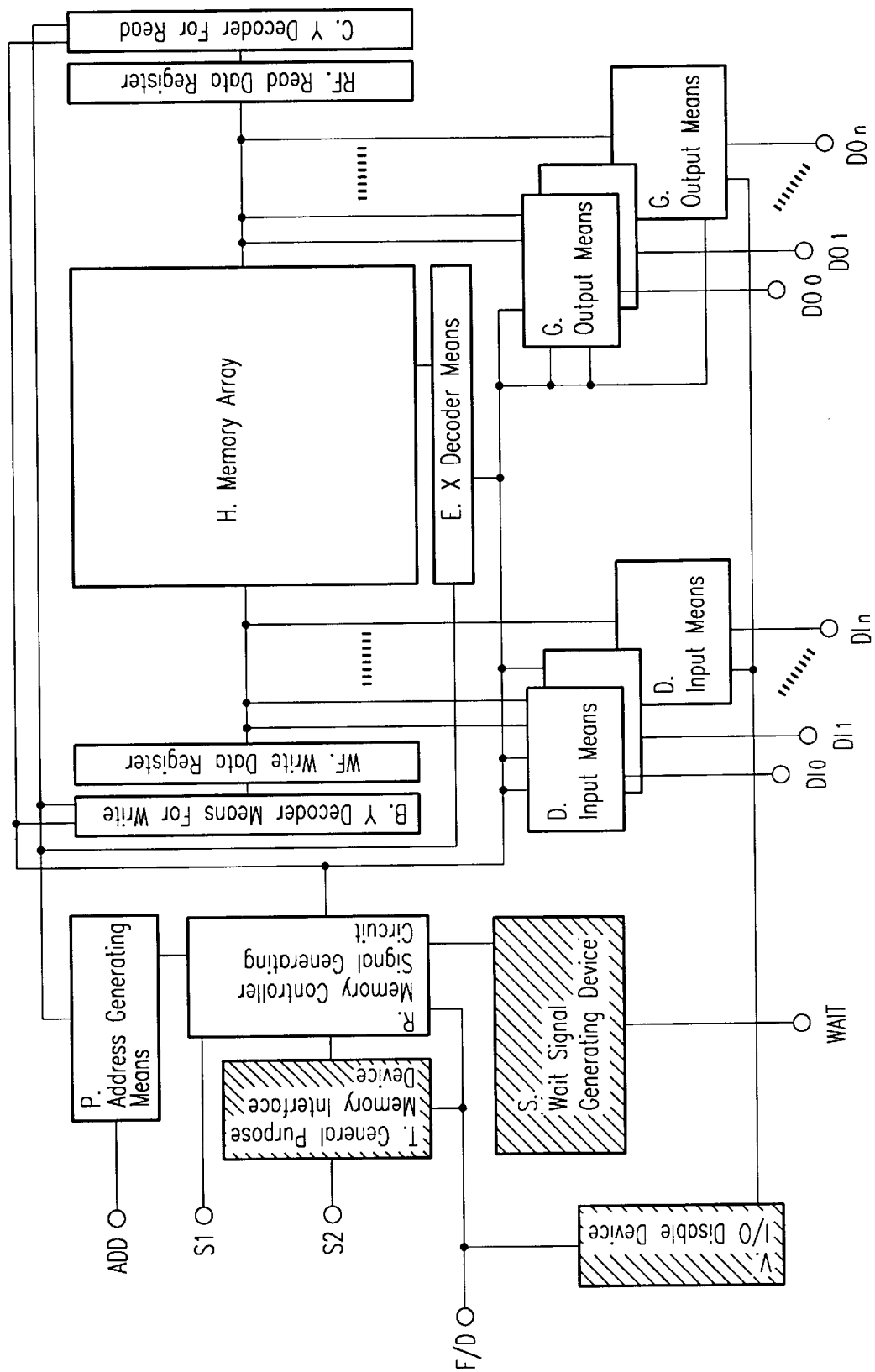
FIG. 14 is a drawing showing a sixth embodiment of this embodiment.

FIG. 14 is a block diagram showing an FRAM of a sixth embodiment of the present invention.

The subject of this embodiment is an FRAM in which there are a plurality (in this embodiment, n) of input means D and output means G (hereinafter referred to as I/O). The wait signal generator S and the general purpose memory interface T are the same as the fifth embodiment.

Further, in this embodiment, an I/O disable device V is also provided. The I/O disable device V has the function of placing any unneeded I/O's into a disabled state when the number of I/O devices to be operated varies when operating the general purpose memory.

The general purpose memory interface T, memory control signal generator R and I/O disable device V are connected to an external selection signal input terminal F/D. The general purpose memory interface T and memory control signal generating means R operate in the same way as in the fifth embodiment.

When the external selection signal designates FRAM control signals, the I/O's disable device puts all of the I/O's into an enabled state. Conversely, when the external selection signal designates general purpose memory control signals, The I/O's disable device V puts I/O's that are not required in the general purpose memory operation in to a disabled state. Operation of other devices is the same as in the fifth embodiment.

According to the sixth embodiment, an additional advantage over the fifth embodiment is that since the FRAM having a plurality of I/O's is provided with the I/O's disable device V, it is possible to disable unnecessary I/O's at the time of operation of a general purpose memory.

Figure 15:
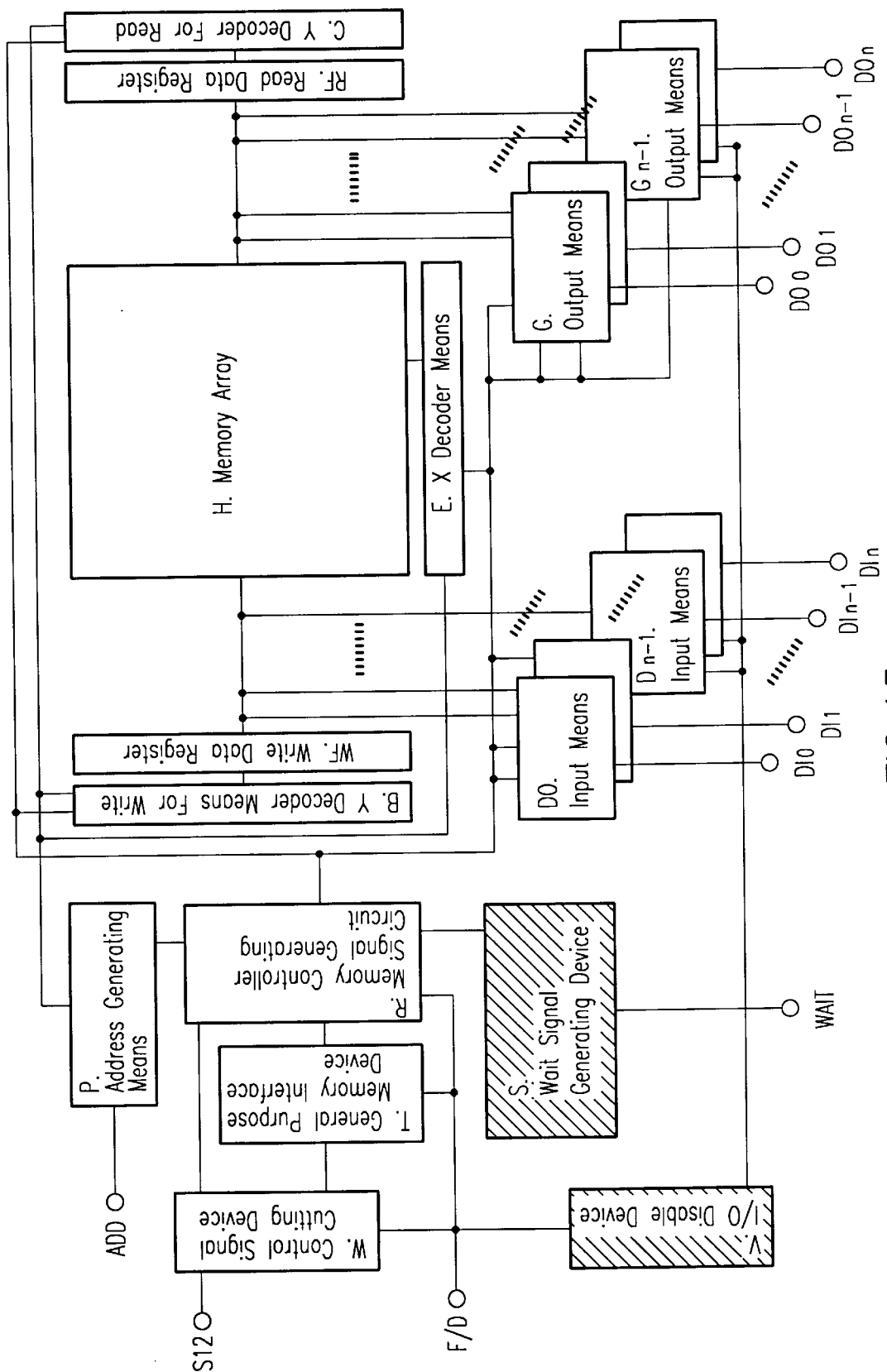
FIG. 15 is a drawing showing a seventh embodiment of this embodiment.

FIG. 15 is a block diagram showing an FRAM of a seventh embodiment of the present invention.

In this embodiment, a control signal selector W is added to the sixth embodiment. The control signal selector W is connected to an input terminal S12 for being input with FRAM control signals and general purpose memory control signals, as well as to the external selection signal input terminal F/D. The control signal selector W judges whether FRAM control signals or general purpose memory control signals are being input, according to the external selection signal, and in the event that FRAM control signals are being input, they are input to the memory control signal generator R, while in the event that general purpose memory control signals are being input they are input to general purpose memory interface T. The control signal selector W can also put the general purpose memory interface T into a disabled state, as required. The operation of other devices is the same as in the sixth embodiment.

According to the seventh embodiment, in addition to the advantages of the sixth embodiment, there is the advantage that the memory control signal input terminal can be shared.

Figure 16:
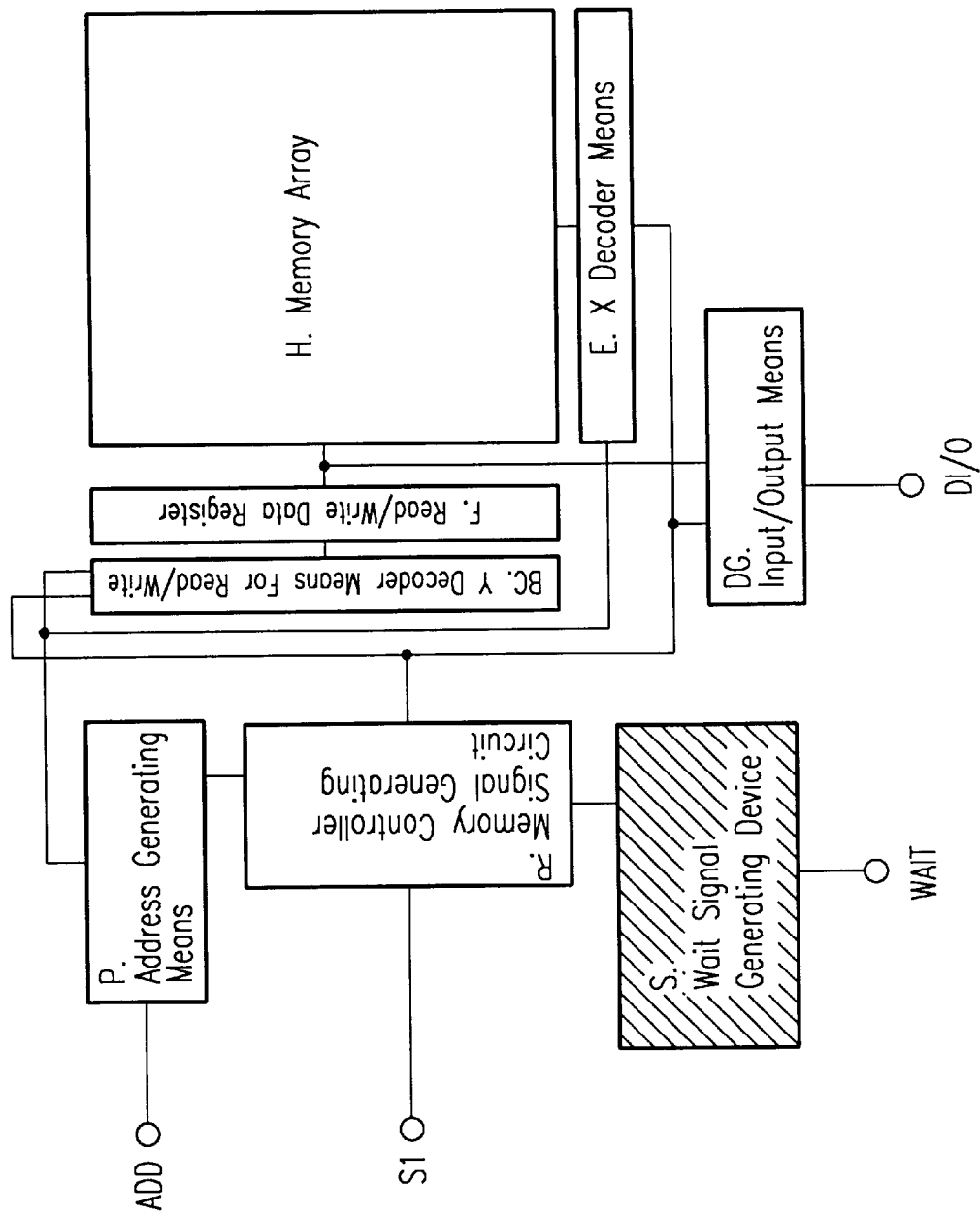
FIG. 16 is a drawing showing an eighth embodiment of this embodiment.

FIG. 16 is a block diagram showing an FRAM of an eighth embodiment of the present invention.

In this embodiment, the FRAM is different from the FRAM of the first embodiment in that it has common read/write Y decode means BC, common read/write data register F, and input output means DG, but apart from these components, this embodiment is the same as the first embodiment. The operation of the common read/write decode means, data register and input output means is the same as that in the conventional art, and so the detailed description thereof will be omitted. Other parts are the same as in the first embodiment, so description thereof will also be omitted.

Figure 17:
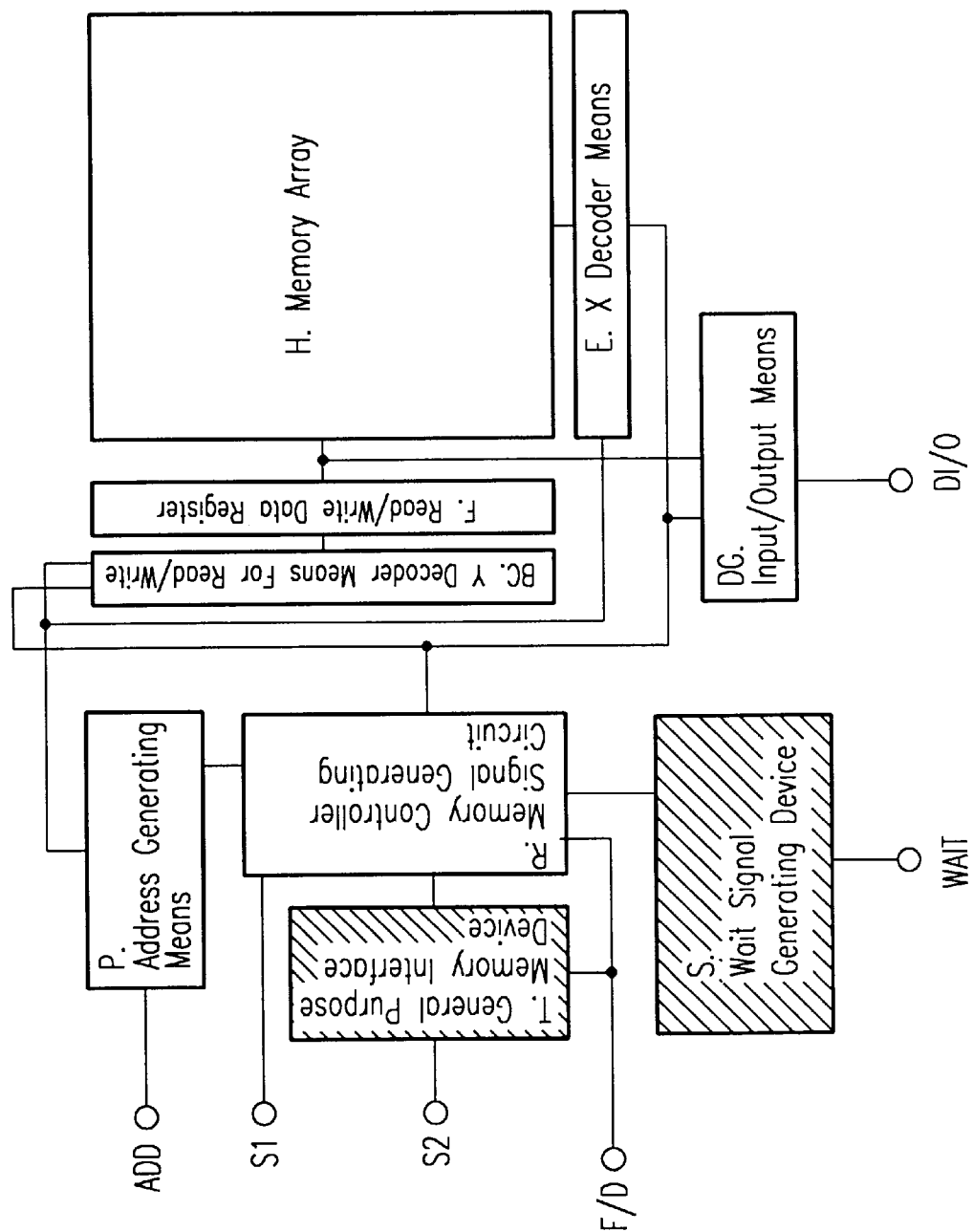
FIG. 17 is a drawing showing a ninth embodiment of this embodiment.

FIG. 17 is a block diagram showing an FRAM of a ninth embodiment of the present invention.

In this embodiment, the FRAM is different from the FRAM of the second embodiment in that there are common read/write Y decode means BC, common read/write data register F, and input output means DG, but apart from these components, the FRAM is the same as in the second embodiment. The operation of the common read/write decode means, data register and input output means is the same as that in the conventional art, and so the detailed description thereof will be omitted. Other parts are the same as in the second embodiment, so description thereof will also be omitted.

Figure 18:
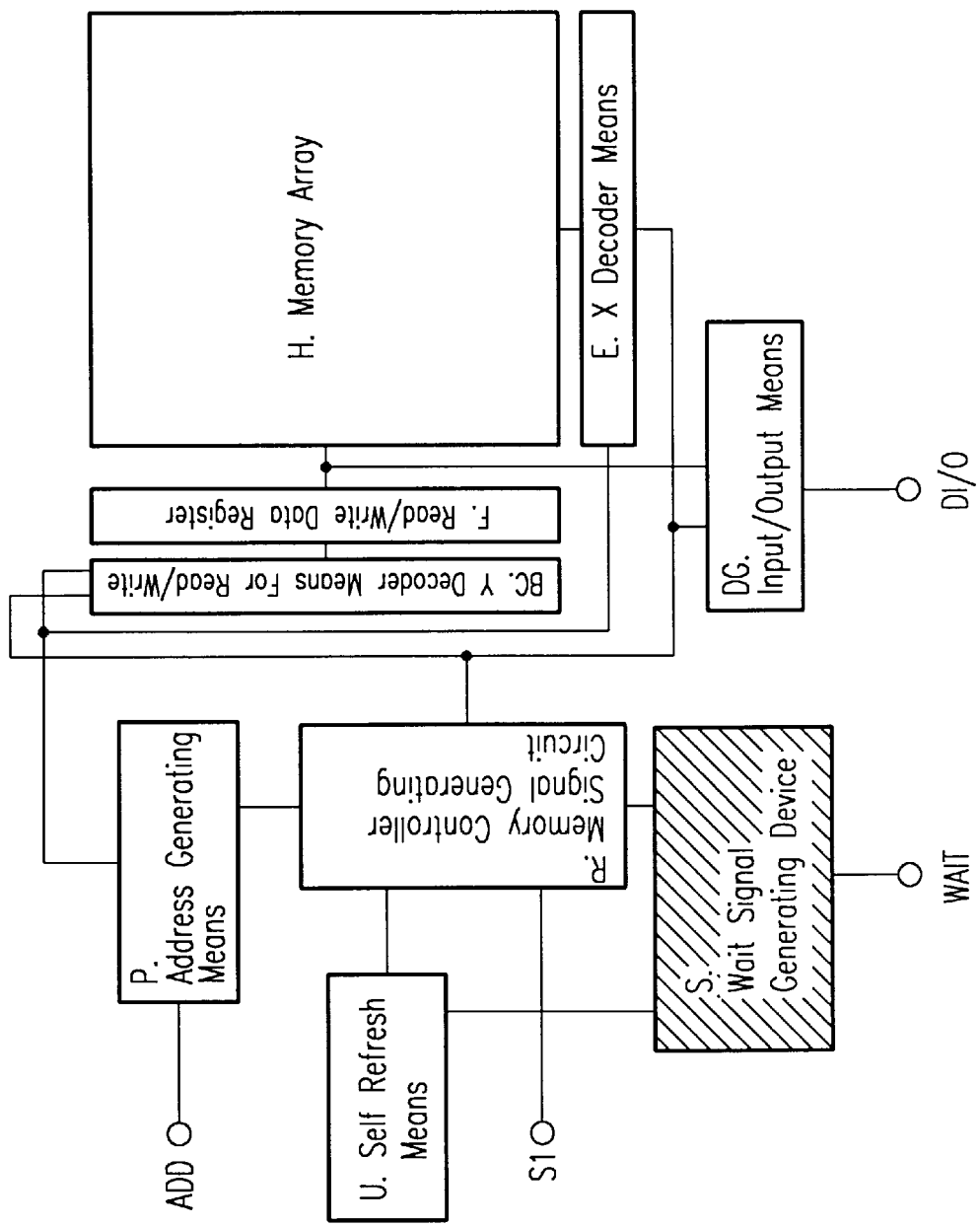
FIG. 18 is a drawing showing a tenth embodiment of this embodiment.

FIG. 18 is a block diagram showing an FRAM of a tenth embodiment of the present invention.

In this embodiment, the FRAM is different from the FRAM of the third embodiment in that there are common read/write Y decode means BC, common read/write data register F, and input output means DG, but apart from these components, the FRAM is the same as in the third embodiment. The operation of the common read/write decode means, data register and input output means is the same as that in the conventional art, and so the detailed description thereof will be omitted. Other parts are the same as in the third embodiment, so description thereof will also be omitted.

Figure 19:
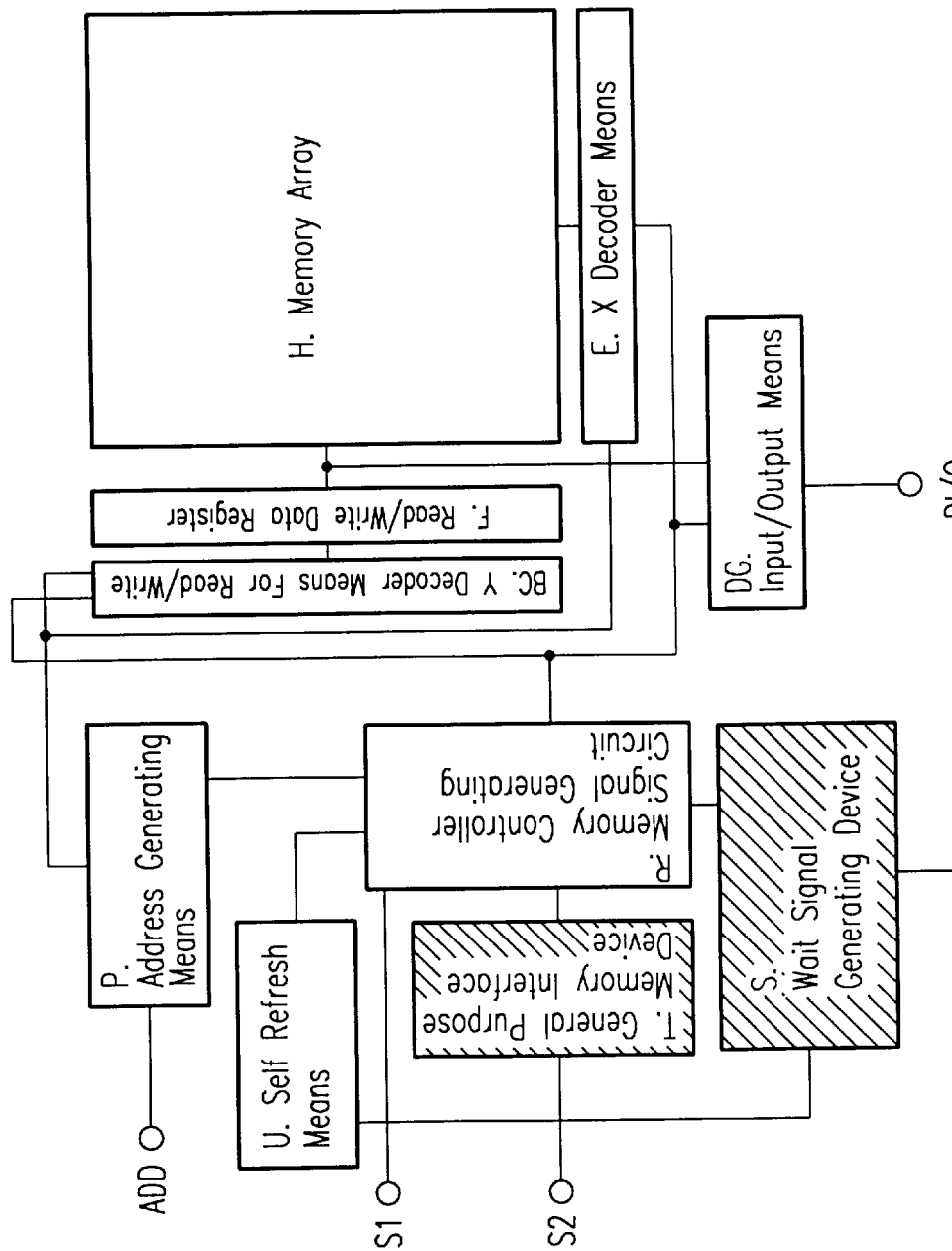
FIG. 19 is a drawing showing an eleventh embodiment of this embodiment.

FIG. 19 is a block diagram showing an FRAM of an eleventh embodiment of the present invention.

In this embodiment, the FRAM is different from the FRAM of the fourth embodiment in that there are common read/write Y decode means BC, common read/write data register F, and input output means DG, but apart from these components, the FRAM is the same as in the fourth embodiment. The operation of the common read/write decode means, data register and input output means is the same as that in the conventional art, and so the detailed description thereof will be omitted. Other parts are the same as in the fourth embodiment, so description thereof will also be omitted.

Figure 20:
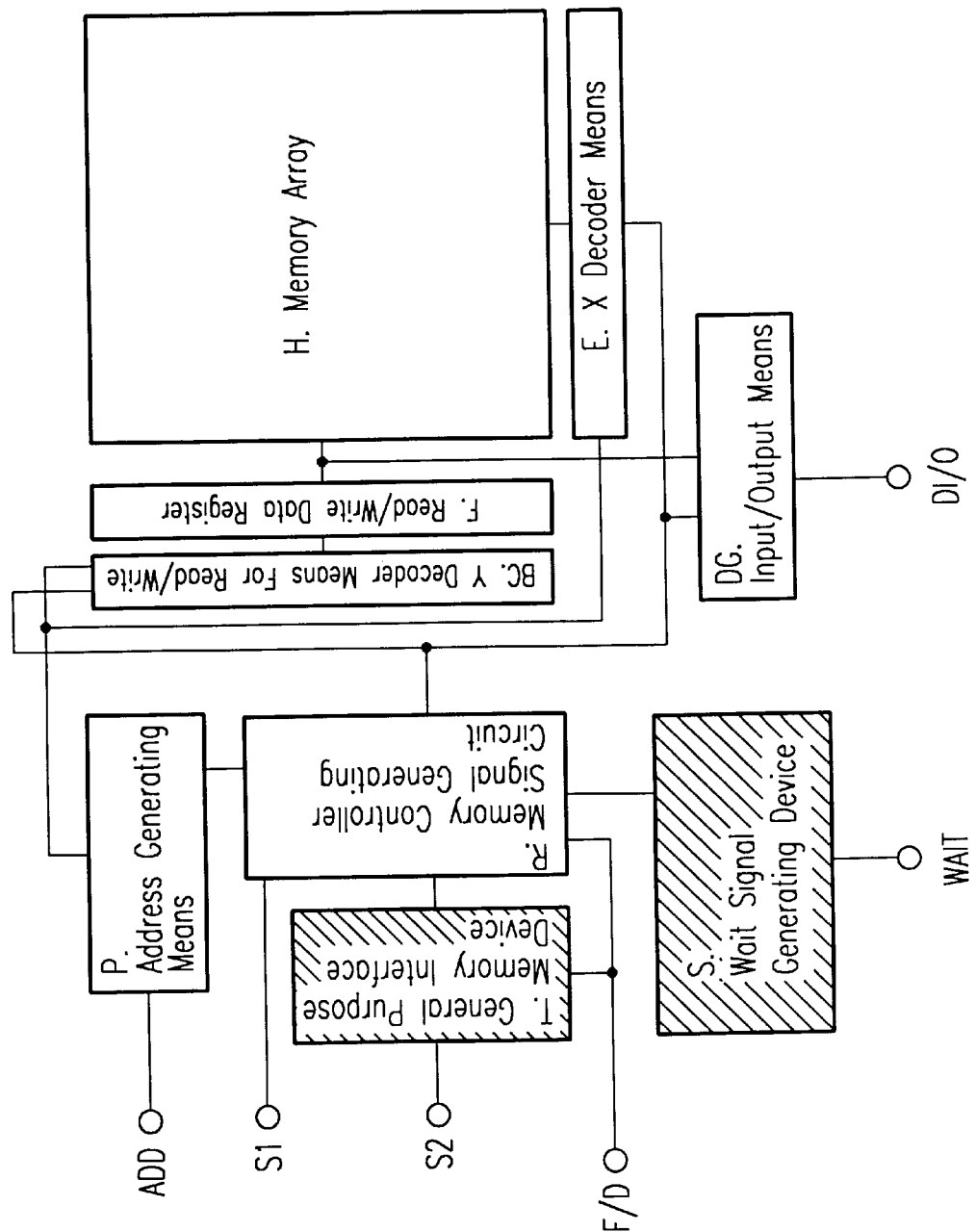
FIG. 20 is a drawing showing a twelfth embodiment of this embodiment.

FIG. 20 is a block diagram showing an FRAM of a twelfth embodiment of the present invention.

In this embodiment, the FRAM is different from the FRAM of the fifth embodiment in that there are common read/write Y decode means BC, common read/write data register F, and input output means DG, but apart from these components, the FRAM is the same as in the fifth embodiment. The operation of the common read/write decode means, data register and input output means is the same as that in the conventional art, and so the detailed description thereof will be omitted. Other parts are the same as in the fifth embodiment, so description thereof will also be omitted.

Figure 21:
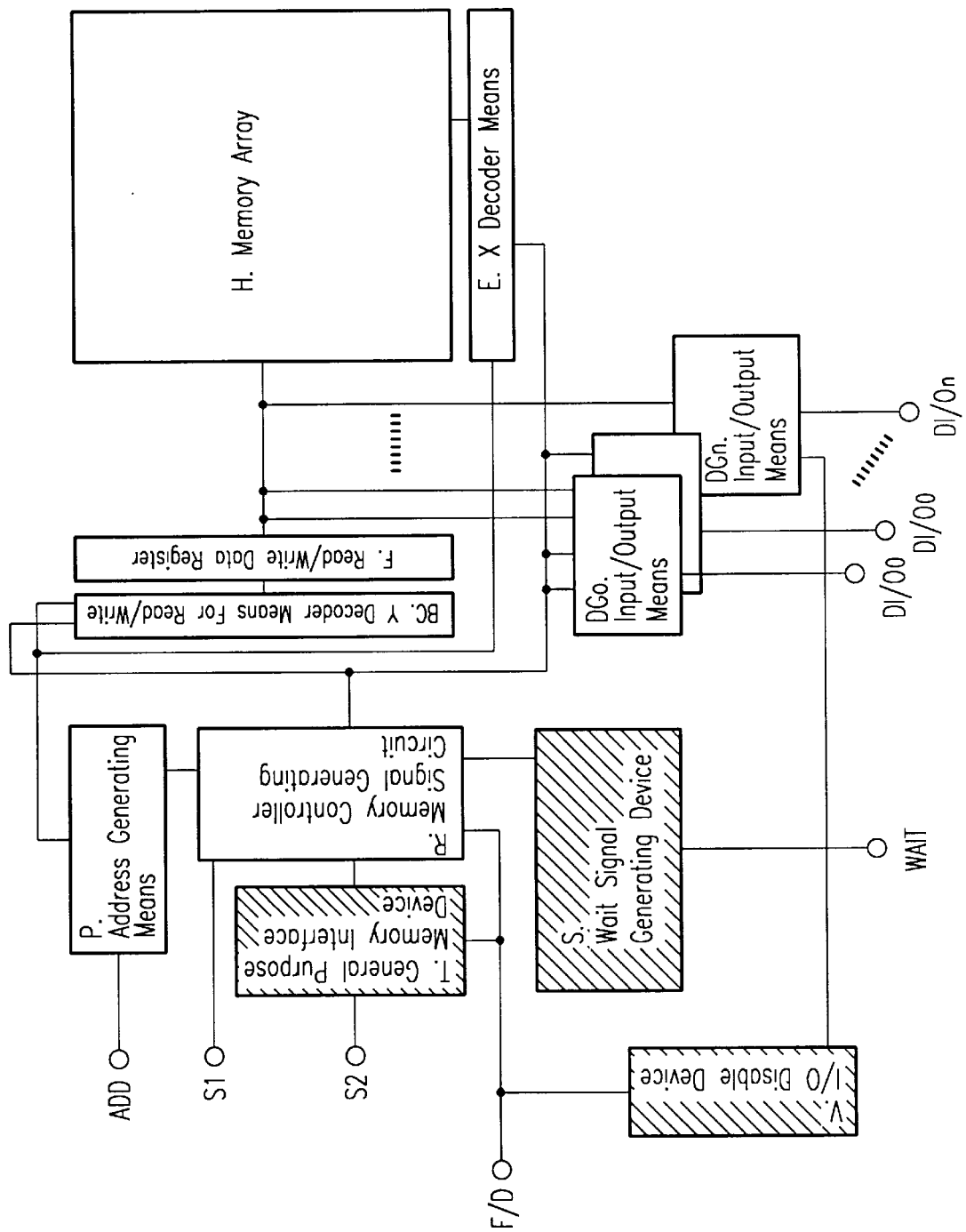
FIG. 21 is a drawing showing a thirteenth embodiment of this embodiment.

FIG. 21 is a block diagram showing an FRAM of a thirteenth embodiment of the present invention.

In this embodiment, the FRAM is different from the FRAM of the sixth embodiment in that there are common read/write Y decode means BC, common read/write data register F, and input output means DG0–DGn, but apart from these components, the FRAM is the same as in the sixth embodiment. The operation of the common read/write decode means, data register and input output means is the same as that in the conventional art, and so the detailed description thereof will be omitted. Other parts are the same as in the sixth embodiment, so description thereof will also be omitted.

Figure 22:
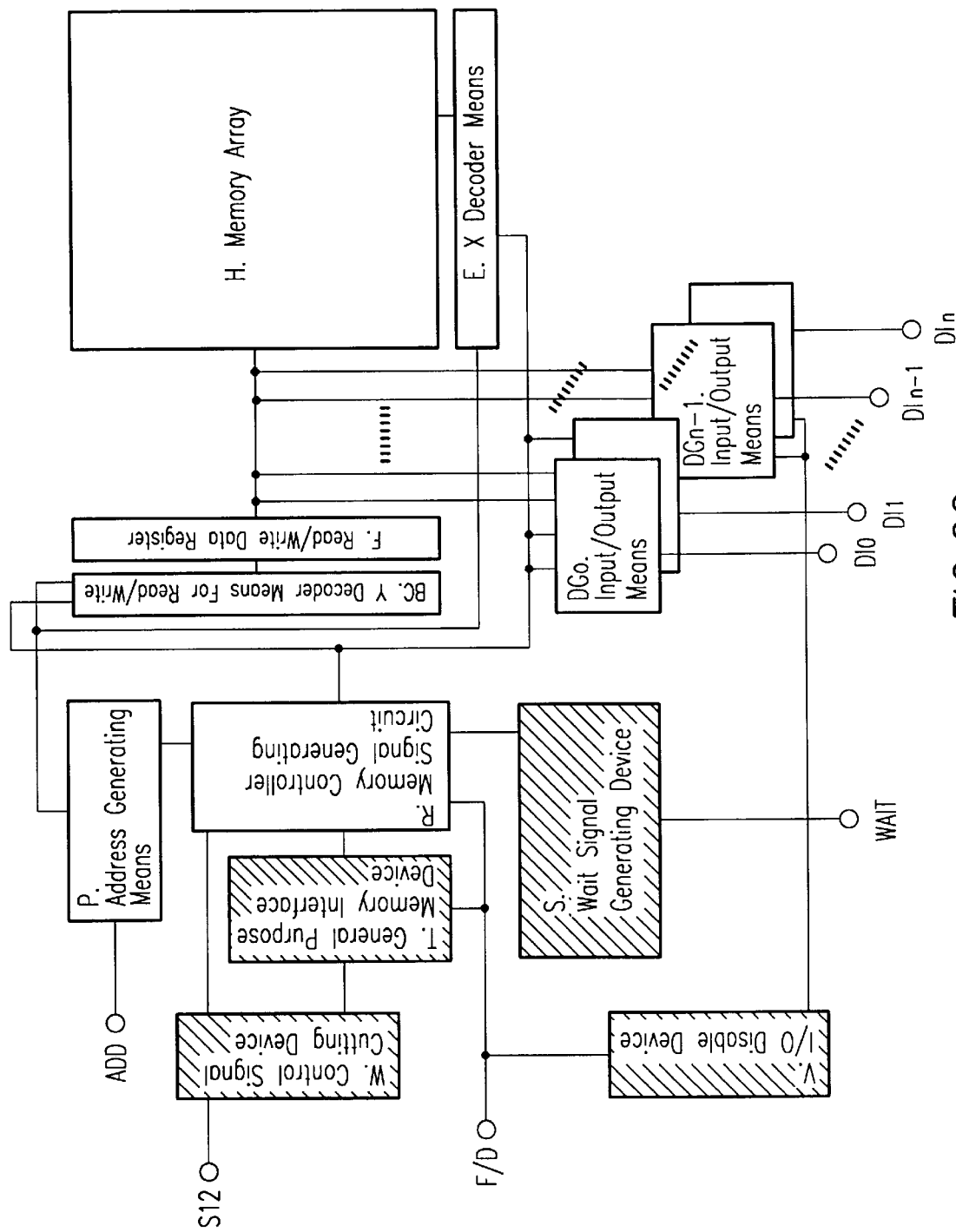
FIG. 22 is a drawing showing a fourteenth embodiment of this embodiment.

FIG. 22 is a block diagram showing an FRAM of a thirteenth embodiment of the present invention.

In this embodiment, the FRAM is different from the FRAM of the seventh embodiment in that there are common read/write Y decode means BC, common read/write data register F, and input output means DG0–DGn, but apart from these components, the FRAM is the same as in the seventh embodiment. The operation of the common read/write decode means, data register and input output means is the same as that in the conventional art, and so the detailed description thereof will be omitted. Other parts are the same as in the seventh embodiment, so description thereof will also be omitted.

Field of Industrial Utilization

As has been described above, the graphic memory of the present invention uses a general purpose memory, such as a DRAM, and is suitable for use as a memory for storing image information that has been taken from a video camera having a CCD etc.

I claim:

1. A graphic memory circuit having a serial data read/write access operation and a normal data read/write access operation, the serial data read/write access operation including a write data transfer cycle and a read data transfer cycle, said graphic memory circuit comprising:

a memory cell array for storing serial data and normal data;

a write data register coupled to said memory cell array for outputting the serial data to said memory cell array during the write data transfer cycle;

a read data register coupled to said memory cell array for receiving the serial data from said memory cell array during the read data transfer cycle;

a memory control signal generator for generating a plurality of internal memory control signals in response to a plurality of external control signals including graphic memory control signals and general purpose memory control signals; and a wait signal generator for generating a wait signal in response to the internal memory control signals, the wait signal being output when the graphic memory circuit is in the write data transfer cycle or the read data transfer cycle.

2. A graphic memory circuit according to claim 1, wherein said memory cell array includes a plurality of word lines, and wherein said graphic memory circuit further comprises an X decoder which charges the word line in response to a word line drive signal which is one of the internal memory control signals.

3. A graphic memory circuit according to claim 2, wherein said write data register outputs the serial data to said memory cell array in response to a write transfer signal which is one of the internal memory control signals, said read data register receives the serial data from said memory cell array in response to a read transfer signal which is one of the internal memory control signals, and said wait signal generator outputs the wait signal in response to the word line drive signal, the write transfer signal and the read transfer signal.

4. A graphic memory circuit according to claim 1, wherein said write data register outputs the serial data to said memory cell array in response to a write transfer signal which is one of the internal memory control signals, said read data register receives the serial data from said memory cell array in response to a read transfer signal which is one of the internal memory control signals, and said wait signal generator outputs the wait signal in response to the write transfer signal and the read transfer signal.

5. A graphic memory circuit according to claim 1, further comprising a self refresh circuit coupled to said memory control signal generator and said wait signal generator for self refreshing said memory cell array, and wherein said wait signal generator outputs the wait signal when the graphic memory circuit is in the write data transfer cycle, the read data transfer cycle or the self refreshing operation.

6. A graphic memory circuit according to claim 1, wherein said graphic memory circuit further comprises a general purpose memory interface circuit coupled to said memory control signal generator for receiving the general purpose memory control signals.

7. A graphic memory circuit according to claim 6, further comprising an external selection signal input terminal coupled to said memory control signal generator and said general purpose memory interface circuit for receiving an external selection signal, and wherein said general purpose memory interface circuit is disabled in response to the external selection signal.

8. A graphic memory circuit according to claim 7, further comprising an operating input circuit coupled to said memory cell array for receiving input data;

a disabling input circuit coupled to said memory cell array and said external selection signal input terminal for receiving input data, said disabling input circuit being disabled when it receives the external selection signal;

an operating output circuit coupled to said memory cell array for providing output data; and a disabling output circuit coupled to said memory cell array and said external selection signal input terminal for providing the output data, said disabling output circuit being disabled when it receives the external selection signal.

9. A graphic memory circuit according to claim 6, further comprising a control signal selector coupled to said memory control signal generator and said general purpose memory interface circuit for receiving the external control signals, said control signal selector determining whether the received external signals are graphic memory control signals or general purpose memory control signals and transferring the received graphic memory control signals to said memory control signal generator and the received general purpose memory control signals to said general purpose memory interface circuit.

10. A graphic memory circuit having a serial data read/write access operation and a normal data read/write access operation, the serial data read/write access operation including a write data transfer cycle and a read data transfer cycle, said graphic memory circuit comprising:

a memory cell array for storing serial data and normal data;

a read/write data register coupled to said memory cell array for outputting the serial data to said memory cell array during the write data transfer cycle and receiving the serial data from said memory cell array during the read data transfer cycle;

a memory control signal generator for generating a plurality of internal memory control signals in response to a plurality of external control signals including graphic memory control signals and general purpose memory control signals; and a wait signal generator for generating a wait signal in response to the internal memory control signals, the wait signal being output when the graphic memory circuit is in the write data transfer cycle or the read data transfer cycle.

11. A graphic memory circuit according to claim 10, wherein said memory cell array includes a plurality of word lines, and wherein said graphic memory circuit further comprises an X decoder which charges the word lines in response to a word line drive signal which is one of the internal memory control signal.

12. A graphic memory circuit according to claim 11, wherein said write data register outputs the serial data to said memory cell array in response to a write transfer signal which is one of the internal memory control signals, said read data register receives the serial data from said memory cell array in response to a read transfer signal which is one of the internal memory control signals, and said wait signal generator outputs the wait signal in response to the word line drive signal, the write transfer signal and the read transfer signal.

13. A graphic memory circuit according to claim 10, wherein said write data register outputs the serial data to said memory cell in response to a write transfer signal which is one of the internal memory control signals, said read data register receives the serial data from said memory cell array in response to a read transfer signal which is one of the internal memory control signals, and said wait signal generator outputs the wait signal in response to the write transfer signal and the read transfer signal.

14. A graphic memory circuit according to claim 10, further comprising a self refresh circuit coupled to said memory control signal generator and said wait signal generator for self refreshing said memory cell array, and wherein said wait signal generator outputs the wait signal when the graphic memory circuit is in the write data transfer cycle, the read data transfer cycle or the self refreshing operation.

15. A graphic memory circuit according to claim 10, wherein said graphic memory circuit further comprises a general purpose memory interface circuit coupled to said memory control signal generator for receiving the general purpose memory control signals.

16. A graphic memory circuit according to claim 15, further comprising an external selection signal input terminal coupled to said memory control signal generator and said general purpose memory interface circuit for receiving an external selection signal, and wherein said general purpose memory interface circuit is disabled in response to the external selection signal.

17. A graphic memory circuit according to claim 16, further comprising an operating input circuit coupled to said memory cell array for receiving input data;

a disabling input circuit coupled to said memory cell array and said external selection signal input terminal for receiving input data, said disabling input circuit being disabled when it receives the external selection signal;

an operating output circuit coupled to said memory cell array for providing output data; and a disabling output circuit coupled to said memory cell array and said external selection signal input terminal for providing the output data, said disabling output circuit being disabled when it receives the external selection signal.

18. A graphic memory circuit according to claim 15, further comprising a control signal selector coupled to said memory control signal generator and said general purpose memory interface circuit for receiving the external control signals, said control signal selector determining whether the received external signals are graphic memory control signals or general purpose memory control signals and transferring the received graphic memory control signals to said memory control signal generator and the received general purpose memory control signals to said general purpose memory interface circuit.

19. A video camera system comprising:

an image converter for generating digital image data;

a graphic memory circuit having a serial data read/write access operation in which the digital image data is accessed and a normal data read/write access operation in which normal data is accessed, the serial data read/write access operation including a write data transfer cycle and a read data transfer cycle, said graphic memory circuit including (a) a memory control signal generator for generating a plurality of internal memory control signals in response to a plurality of external control signals including graphic memory control signals and general purpose memory control signals, and (b) a wait signal generator for generating a wait signal in response to the internal memory control signals, the wait signal being output when the graphic memory circuit is in the write data transfer cycle or the read data transfer cycle;

a graphic memory controller for controlling said graphic memory using the graphic memory control signals; and a general controller for controlling said graphic memory circuit using the general purpose memory control signals, said general controller being prevented from accessing said graphic memory circuit in response to the wait signal.

20. A video camera system according to claim 19, wherein said graphic memory further comprises a memory cell array for storing the digital image data and the normal data;

a write data register coupled to said memory cell array for outputting the digital image data to said memory cell during the write data transfer cycle; and a read data register coupled to said memory cell array for receiving the digital image data from said memory cell during the read data transfer cycle.

21. A video camera system according to claim 19, wherein said graphic memory further comprises a memory cell array for storing the digital image data and the normal data; and a read/write data register coupled to said memory cell array for outputting the digital image data to said memory cell during the write data transfer cycle and receiving the digital image data from said memory cell during the read data transfer cycle.

* * * * *